(12) United States Patent
Restuccia et al.

(10) Patent No.: US 9,640,297 B2
(45) Date of Patent: May 2, 2017

(54) COMPOSITE MATERIALS COMPRISING CONDUCTIVE NANO-FILLERS

(71) Applicant: Cytec Technology Corp., Wilmington, DE (US)

(72) Inventors: Carmelo Luca Restuccia, Chester (GB); Fiorenzo Lenzi, Vitulazio (CE) (IT); Emiliano Frulloni, Rossett (GB); Natalie Denise Jordan, Chester (GB); Mark Edward Harriman, Redcar (GB)

(73) Assignee: CYTEC TECHNOLOGY CORP., Wilmington, DE (US)

( * ) Notice: Subject to any disclaimer, the term of this patent is extended or adjusted under 35 U.S.C. 154(b) by 51 days.

(21) Appl. No.: 14/356,653

(22) PCT Filed: Dec. 19, 2012

(86) PCT No.: PCT/US2012/070472
§ 371 (c)(1),
(2) Date: May 7, 2014

(87) PCT Pub. No.: WO2013/141916
PCT Pub. Date: Sep. 26, 2013

(65) Prior Publication Data
US 2014/0306164 A1    Oct. 16, 2014

(30) Foreign Application Priority Data

Dec. 23, 2011 (GB) .................. 1122296.5

(51) Int. Cl.
*H01B 1/06* (2006.01)
*H01B 1/24* (2006.01)
(Continued)

(52) U.S. Cl.
CPC ............... *H01B 1/22* (2013.01); *C08K 3/04* (2013.01); *C08K 7/24* (2013.01)

(58) Field of Classification Search
CPC ..................... B82Y 30/00; C08G 59/5033
(Continued)

(56) References Cited

U.S. PATENT DOCUMENTS 3,305,527 A    2/1967  Price
8,946,332 B2   2/2015  Cawse et al.
(Continued)

FOREIGN PATENT DOCUMENTS

CN     101508824 A    8/2009
EP       180 012 A1   5/1986
(Continued)

*Primary Examiner* — Khanh Tuan Nguyen
(74) *Attorney, Agent, or Firm* — Thi Dang

(57) ABSTRACT

A process for the production of a composition comprising one or more conductive nano-filler(s), one or more polyarylethersulphone thermoplastic polymer(s) (A), one or more uncured thermoset resin precursor(s) (P), and optionally one or more curing agent(s) therefor, wherein said process comprises mixing or dispersing a first composition comprising one or more conductive nano-filler(s) and one or more polyarylethersulphone thermoplastic polymer(s) (A) with or into one or more uncured thermoset resin precursor(s) (P), and optionally one or more curing agent(s) therefor.

15 Claims, 11 Drawing Sheets

Figure 1:
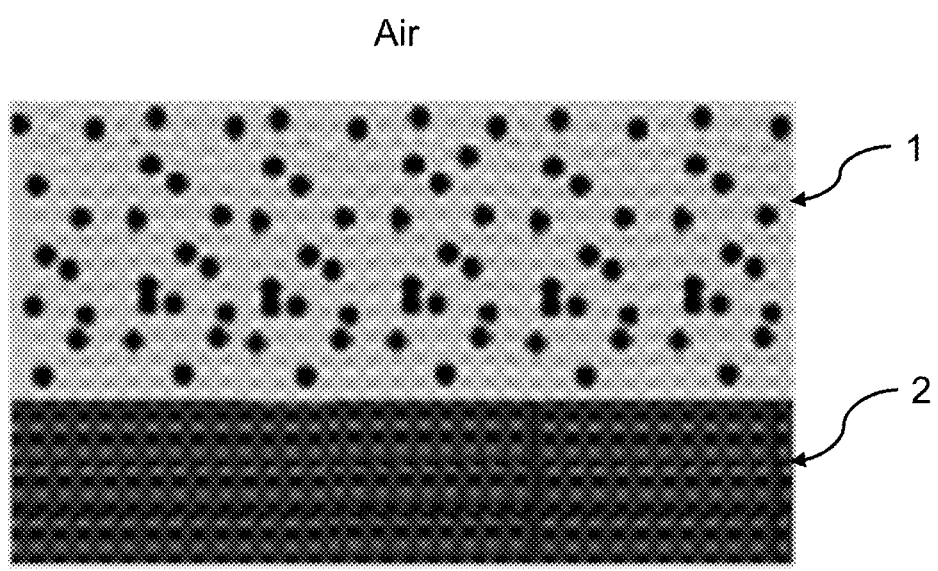

(51) Int. Cl.
*H01B 1/22* (2006.01)
*C08K 3/04* (2006.01)
*C08K 7/24* (2006.01)

(58) Field of Classification Search
USPC .......................................... 252/511; 524/495
See application file for complete search history.

(56) References Cited

U.S. PATENT DOCUMENTS

| | | | |
|---|---|---|---|
| 2005/0070657 A1* | 3/2005 | Elkovitch | B82Y 30/00 524/495 |
| 2006/0069199 A1 | 3/2006 | Charati et al. | |
| 2008/0213487 A1 | 9/2008 | Park et al. | |
| 2011/0163275 A1* | 7/2011 | Simmons | C08G 59/5033 252/511 |

FOREIGN PATENT DOCUMENTS

| | | |
|---|---|---|
| EP | 2204403 A1 | 7/2010 |
| JP | 2007-332234 | 12/2007 |
| JP | 2011-144213 | 7/2011 |
| WO | 02/16456 A2 | 2/2002 |
| WO | 2010/098966 A1 | 9/2010 |
| WO | 2011112405 | 9/2011 |

* cited by examiner

Example 2b 100 nm   Mag = 100.00 K X

Example 2c 100 nm   Mag = 100.00 K X

Example 2d 100 nm    Mag = 100.00 K X

COMPOSITE MATERIALS COMPRISING CONDUCTIVE NANO-FILLERS

This application is a national stage entry of the International Application No. PCT/US2012/070472 filed on Dec. 19, 2012, which claims the benefit of priority from United Kingdom Application No. 1122296.5 filed on Dec. 23, 2011, both of which are incorporated herein by reference.

The present invention relates to dispersions of conductive nano-fillers (particularly carbon-based conductive nano-fillers) in polymeric matrices (particularly epoxy resin systems) and composites produced therefrom, and methods for their production. The present invention further relates to an improved method for dispersing such nano-fillers in polymeric matrices and in composite structures by the use of a soluble thermoplastic polymer to deliver the nano-fillers into the polymeric matrix. The present invention also relates to composite materials and structures having improved electrical and electromagnetic performance.

Composite materials comprising polymer resins and fillers are well-known as structural materials for their capability to absorb loads and stresses, and offer advantages over metals and ceramics in that the polymer composites are lightweight, easier to manufacture and readily tailored for specific applications, and exhibit high specific stiffness and strength and a low coefficient of thermal expansion. However, the application of these materials to modern aircraft primary and secondary structures presents special challenges due to the dielectric nature of the resin matrix. Composite materials and/or structural modifications are usually required to fulfil the stringent functional and certification requirements of such components in terms of electric and electromagnetic (EM) properties.

The primary structures for modern aircraft should provide capability for lightning strike protection, potential discharge, electrostatic dissipation (ESD), electromagnetic interference (EMI), electrical grounding and electromagnetic shielding. In order for a carbon fibre-reinforced polymer material to achieve such characteristics, it is necessary to achieve a homogeneously conductive material able to improve charge dissipation. Moreover, the most recent use of "third generation materials" in such structures means that improvements are required in the z-direction conductivity of the composite to avoid potential catastrophic accidents caused by the ignition of fuel vapours in the aircraft wing tanks as a result of a lightning strike event. As used herein, the "z-direction" refers to the direction orthogonal to the planes on which the reinforcing fibres are arranged in the composite structure or the axis through the thickness of the composite structure.

Thus, composite structures with tailored electromagnetic properties are required in several applications where it is necessary to control the EM radiation propagation, reflection, absorption and transparency. Aircraft composite structures require high electromagnetic shielding effectiveness to reduce the disturbances caused by external sources such as lightning strike, high-intensity radiated fields (HIRF) and electromagnetic pulses (EMPs) on the on-board systems. The primary shielding mechanism in aircraft structures is reflection and the efficiency is normally a function of the electrical conductivity. Composite structures with EM radiation absorption properties are also required for low observable structures and components used in aircrafts, warships, submarines, missiles and wing turbine blades. State of the art radar absorbing materials (RAMs) are generally based on polymeric compounds containing high loadings of relatively heavy metals or alloys.

An alternative approach can be based on single or multi-layered radar absorbing structures (RAS) designed to reduce the EM radiation reflection through destructive interference mechanisms. Typical examples of such class of structures are Dallenbach layers, Salisbury Screens and Jaumann layers.

Reflectivity can be reduced by designing structures with specific thicknesses using materials with tailored complex permittivity ($\in$) and permeability ($\mu$) properties.

The ability of a material to absorb energy is a function of the ratio between the imaginary and the real parts, or equivalently of the loss tangents, in accordance with the following expression:

$$\tan \delta_\in = \in''/\in' \quad \tan \delta_\mu = \mu''/\mu'$$

For dielectric material modified by conductive fillers, the absorbing capability can be enhanced through its complex permittivity modification, which at microwave frequencies is closely related to the electrical conductivity.

Carbon nanotubes (CNTs) are a class of conductive fillers which can be used to modify electric and electromagnetic characteristics due to their low density, excellent electrical conductivity, as well as excellent mechanical properties, high thermal conductivity and high thermal stability. However, the use of CNTs in composite materials has been limited due to problems in dispersing them effectively in the composite matrix, which is critical to the improvement of the conductivity of the matrix, and to do so without jeopardizing thermo-mechanical performance. The onset of electrical conductivity in a CNT composite occurs when a critical filler content (referred to as the "percolation threshold") is reached and the conductive fillers form a conductive pathway. As used herein, the percolation threshold is the filler content to achieve conductivity values in direct current (DC) conditions equal to or greater than $10^{-6}$ S/m.

Various attempts have been made to compatibilize and disperse CNTs in polymeric matrices. US-2004/0186220-A discloses a method for compatibilizing and dispersing high contents of single-walled carbon nanotubes (SWCNTs) in electrically insulating matrixes using a solvent-assisted procedure, and manufacturing composite fibres, films and solids through a polymer coating/wrapping process. US-2010/0009165-A, US-2008/0194737-A, US-2008/0187482-A and US-2006/0054866-A describe the functionalization of CNTs in a "non-wrapping" fashion using functionalized conjugated polymers such as polyarylene ethynylenes, which are then dispersed in thermoplastics and thermosets. WO-2010/007163-A reports the use of a CNT-modified binder to coat structural fibres in composite structures, which purports to solve manufacturing issues connected to the viscosity of highly CNT-loaded systems, especially for infusion applications. US-2009/0298994-A discloses a CNT dispersion process in a polyolefinic matrix comprising the in-situ polymerization of a polyolefin on the nanofiller surface and the subsequent dispersion of the obtained material in the matrix. US-2010/0189946-A reports the use of a combination of linear and functionalized/grafted fluorinated polymers to compatibilize CNTs in polymer matrices. US-2009/0176924-A discloses a method to produce highly concentrated CNT pulverulent master-batches in various polymers. WO-2009/147415-A reports a material comprising at least one thermosetting resin, carbon conductive additive materials and at least one thermoplastic polymer resin that dissolves in the resin and phase separates upon cure. In addition, there are various commercially available, but relatively expensive, CNT products in which the CNT is pre-dispersed in a resin precursor system, for instance CNT/ epoxy masterbatches, which are reported as achieving optimum dispersion levels in an epoxy or epoxy blend resin system.

There remains a need for an effective and economic method for the dispersion of conductive carbon-based nano-fillers in structural polymeric matrices, particularly epoxy resin and other thermoset resin systems, in order to modify or improve the properties of such polymeric matrices, particularly the electrical conductivity and permittivity thereof. Further, there remains a need for the dispersion of such nano-fillers in such polymeric matrices without re-agglomeration or segregation during processing and cure. In addition, there remains a need for increasing the concentration of conductive carbon-based nano-fillers in such structural polymeric matrices and composites without adversely affecting their processability and thermo-mechanical performance. The object of the invention is to satisfy one or more of these needs.

The present invention provides a process for the production of a composition comprising one or more conductive nano-filler(s), one or more polyarylethersulphone thermoplastic polymer(s) (A), one or more uncured thermoset resin precursor(s) (P), and optionally one or more curing agent(s) therefor, wherein said process comprises mixing or dispersing a first composition comprising one or more conductive nano-filler(s) and one or more polyarylethersulphone thermoplastic polymer(s) (A) with or into one or more uncured thermoset resin precursor(s) (P), and optionally one or more curing agent(s) therefor.

The present invention further provides various compositions, described hereinbelow.

Accordingly, in a first aspect of the invention there is provided a composition comprising one or more conductive nano-filler(s), particularly carbon-based conductive nano-filler(s), and one or more polyarylethersulphone thermoplastic polymer(s) (A).

In the composition of the first aspect of the present invention, the nano-filler is coated or wrapped with one or more molecules of the thermoplastic polymer (A). The interaction between the nano-filler and the polyarylethersulphone does not rely on, and it is believed does not involve, covalent or other chemical bonds therebetween. Instead, the chemical backbone and end-groups of the polyarylethersulphone are able to interact with the electronic structure of the nano-filler to provide non-covalent association. It is the inventors' contention that the specific sequence of strong electron-withdrawing groups (—$SO_2$—) and strong donating groups (—O—) on the molecular scale facilitates electronic interaction between the polymer and the nano-filler, resulting in high nano-filler dispersion, high charge transfer and high conductivity. It is believed that the interaction between the polymer and the nano-filler is facilitated by n-electron interactions.

The term "coating" or "wrapping" refers to the polyarylethersulphone macromolecule(s) being in contact with, or in association with, the surface of the nano-filler, and includes the polyarylethersulphone macromolecule(s) covering all or part of the surface. In embodiments where the nano-filler is a nano-tube, the surface coated or wrapped with the polyarylethersulphone molecule(s) is the exterior surface. The term "coating" or "wrapping" is not intended to confer any regularity or symmetrical configuration to the arrangement of the polyarylethersulphone macromolecule(s) on the nano-filler surface.

In a preferred embodiment of the invention, at least a portion of the conductive nano-filler must be dispersed in, or coated or wrapped with, the thermoplastic polymer prior to mixing or contacting with the thermosetting resin precursor(s). Thus, the compositions of the first aspect of the invention do not comprise uncured thermoset resin precursor(s).

The composition comprising polyarylethersulphone-wrapped nano-filler enables the delivery, manipulation and dispersion of the nano-fillers into thermosetting polymeric matrices for the manufacture of composite materials with improved properties. The use of the polyarylethersulphone achieves higher levels of processability and dispersion of the nano-filler in the resin, without re-agglomeration of the nano-filler, and therefore higher levels of electrical conductivity and permittivity in the composite. The level of dispersion can be monitored by microscopic techniques such as high resolution Field Emission Scanning Electron Microscopy (FEG-SEM) or Electron Transmission Microscopy (TEM). In the present invention, the conductive nano-filler is suitably dispersed throughout the cured composition or composite and, where the thermoplastic polymer and thermoset resin precursor(s) have undergone phase-separation during cure, the conductive nano-filler is suitably present in (or otherwise associated with) both the thermoplastic polymer phase and the thermoset resin matrix phase. As noted herein, the thermoplastic polymer suitably undergoes phase separation from the thermoset resin matrix upon cure, resulting in micrometric or sub-micrometric particulate morphologies, and in the resulting cured resin the conductive nano-filler is dispersed homogenously throughout the thermoplastic polymer phase and the thermoset resin matrix phase. Thus, the cured resins of the present invention may be differentiated from systems in which, following phase separation, substantially all (i.e. at least 90 wt %) of the conductive nano-filler is present in the thermoset resin matrix phase (i.e. the non-thermoplastic phase).

An advantage of the invention is that high electrical conductivity and permittivity are obtainable without any intermediate purification or functionalization or dispersion step of the nano-filler, i.e. commercially available industrial grades of nano-filler with a relatively low C purity (90%) can be dispersed directly in the polyarylethersulphone thermoplastic without pre-treatment. As demonstrated hereinbelow, multi-walled CNTs (MWCNTs; such as the NC7000 grade from Nanocyl (Belgium)) having purity as low as 90% C purity can be used without the need for additional purification and/or functionalization processes. An additional purification step typically increases purity to greater than 95% C purity (such as the NC3100 MWCNT grade from Nanocyl). A functionalization step may include —COOH functionalization for example (such as the NC3101 MWCNT grade from Nanocyl, which is also >95% C purity).

In addition, a further advantage of the invention is that high electrical conductivity and permittivity are obtainable without resorting to expensive commercial single-walled or high purity (>95%) CNTs or CNT-epoxy masterbatches. Instead, the invention provides high electrical conductivity and permittivity using lower purity and inexpensive industrial multi-walled CNTs.

Thus, in one embodiment of the present invention, the CNTs are relatively low purity (no more than 95% C purity, and preferably at least about 90% C purity) multi-walled CNTs, which preferably are non-functionalized.

In addition, a further advantage of the invention is that it allows safer handling and better dispersion control of high CNT contents in resin systems and composites using conventional resin mixing and prepregging equipment and processes.

The composition of the first aspect of the invention preferably comprises the conductive nano-filler (CNF) in an amount such that the mass fraction w(CNF) is from about 0.1% to about 30%, preferably from about 0.1% to about 20%, from about 0.1% to about 19%, from about 0.1% to about 15%, preferably from about 1% to about 10%, and typically from about 3% to about 8%, wherein w(CNF) is calculated as:

w(CNF)=m(CNF)/(m(A)+m(CNF)), where m(CNF) is the mass of conductive nano-filler in the composition, and m(A) is the mass of the thermoplastic polymer (A) in the composition.

The compositions of the first aspect of the invention may take various physical forms, as is conventional in the art, including pelletized products, micronized particulate products, continuous or chopped fibers, fibrous materials, woven and nonwoven fabrics. Preferably, the composition of the first aspect of the invention is not a pulverant composition, i.e. it is not in powder form.

In one embodiment, the composition of the first aspect of the invention is in pelletized form, the pellets being prepared by mixing the nano-filler into the molten thermoplastic polymer, for instance using a conventional melt extrusion process in a single- or twin-screw extruder. The thermoplastic polymer and nano-filler may be fed into the extruder either simultaneously or sequentially, and is preferably a homogeneous physical blend of nano-filler and polymer. The temperature within the extruder should be appropriate for optimum rheology of the thermoplastic within the extruder, and is typically in the range of from about 230° C. to about 400° C. A variable temperature profile may be used along the length of the extruder. The extruder may be equipped with screws having conventional low or high shear/mixing profiles or a combination thereof depending on the filler type and content and on the polymer rheological behaviour. In one of the embodiments a sequence of low shear conventional mixing screw sections may be used to achieve satisfactory dispersion levels. In a preferred embodiment, the extruder is equipped with a high-shear screw profile comprising conventional mixing segments associated with chaotic mixing units in order to create the optimum balance between shear and pressure forces in the barrel optimizing the dispersion levels, and such process conditions can be achieved by use of a Prism TS24HC extruder equipped with a 24 mm co-rotating twin screw system with an LD ratio of 40 to 1. Two different feed systems with different feed screws to suite different materials (nanofillers or polymer pellets) may be used. A screw speed of approximately 200-300 RPM and a specific temperature profile in the multiple heating zones in order to achieve a maximum torque of 60-95% may be developed for a given blend.

In a preferred embodiment, the composition of the first aspect of the invention is in micronized particulate form, since this increases dispersability in the thermoset resin matrix, and reduces re-agglomeration of the nano-filler. The micronized particulate form is typically obtained from the pelletized and/or extruded form of the composition. Micronization may be conducted according to conventional techniques known in the art, for instance rotary impact milling, rotoplex milling, rotary classifier milling, ball milling, contrapex milling, fluidised bed opposed jet milling, spiral-flow jet milling, cryogenic milling. In a preferred embodiment, an cryogenic milling system (for instance, an Alpine system) equipped with different rotating grinding media is used. A sequence of steps using stud, beater, swing beater and plate beater discs may be developed to achieve micronized particulates exhibiting an average particle size distribution (d50) in the range of from about 5 to about 300 μm, preferably from about 10 to about 150 μm, more preferably from about 20 to about 90 μm.

In another preferred embodiment, the composition of the first aspect of the invention is in the form of a fibre, film, or woven or non-woven fabric, mat, textile or veil or the like, as disclosed in US-2006/0252334, the disclosure of which is incorporated by reference. The fibre may be in the form of yarns of mono-filaments of spun strands, extruded strands, cast strands, continuous strands, continuous fibres, bi or multi-component fibres, random fibres, staple fibres, discontinuous fibres, chopped fibres, whiskers, hollow fibres and filaments, and combinations thereof. The fibre may be both a yarn made up of multiple mono-filaments or single and multiple mono-filaments. Microfibers may have more complex structures such as sheath/core, side/side, pie segments, islands-in-a-sea and they may be made of different polymers or blends thereof. Polymer microfibers may contain additional organic or inorganic fillers or modifiers.

The composition may be in the form of ribbons, tapes, veils, fleeces and combinations thereof, as well as in combinations with the afore-mentioned fibrous forms. Preferably the fibre (or yarn) comprises fibres each having a diameter of no more than about 100 μm. Preferably a fibre or filament has a diameter d, or is a film, tape or ribbon having a thickness t, wherein d or t are in the range up to and including about 100 μm, preferably from about 1 to about 80 μm, more preferably from about 10 to about 50 μm. A veil is preferably provided with dimensions of from about 2 cm to about 500 cm wide, preferably about 50 cm to about 200 cm wide. A veil made from the composition of the first aspect of the invention is particularly suitable for interposing between adjacent plies of, and in contacting relation to, structural reinforcement fibres (such as carbon fibres) in a perform, particularly a perform which is suitable for use in resin infusion technology which is discussed further hereinbelow. Suitable methods for preparing such fibres, films, non-woven mats and veils and the like are disclosed in US-2006/0252334, the disclosure of which is incorporated by reference.

A woven fabric or textile comprising a fibre made from the composition of the first aspect of the invention includes a hybrid fabric further comprising fibres of reinforcing agents such as carbon fibre, including co-woven reinforcing fibres. Examples of such fabrics include the resin-soluble fibre-containing textiles commercially available as PRIFORM™ (Cytec Engineered Materials).

The compositions of the first aspect of the invention may also be prepared by a process (referred to herein as in situ polymerisation) wherein the conductive nano-filler is present during synthesis of the thermoplastic polymer. The reaction mixture may simply be contacted, optionally in the presence of any catalyst, with the nano-filler either before initiation of the polymerisation reaction or during the polymerisation reaction. Thus, the nano-filler may simply be introduced into the polymerisation reaction vessel, such that the nano-filler is either present in its entirety at the start of the reaction, or the nano-filler may be introduced to or contacted with the reaction mixture continuously or stepwise as the reaction progresses. For instance, an in situ polymerisation process may comprise the steps of: (i) preparing a suspension of the conductive nano-filler in an inert solvent; and (ii) preparing a reaction mixture from the nano-filler suspension and optional catalyst by adding the monomeric reactants and conducting the polymerisation reaction.

The in situ polymerisation reaction may involve the polymerisation of the thermoplastic polymer at or on the surface of the conductive nano-filler and bring about more effective coating or wrapping of the conductive nano-filler with the thermoplastic polymer. In addition, in situ polymerisation may improve dispersion of the nano-filler in the thermoplastic polymer and reduce the tendency for subsequent re-agglomeration. The coated nano-filler particles are recovered from the reaction mixture using conventional techniques, and may be pelletised, micronized or otherwise processed in the normal way.

Thus, in a second aspect, the present invention provides a process for the production of a composition comprising a conductive nano-filler and one or more polyarylethersulphone thermoplastic polymer(s) (A) as described herein. In one preferred embodiment, the composition is prepared by mixing the nano-filler and molten thermoplastic polymer (A), for instance in a twin screw-extruder, preferably utilising high-shear and chaotic mixing profiles, optionally followed by micronization, and dissolution in the thermosetting formulation. In a preferred embodiment, the polyarylethersulphone undergoes phase separation upon cure resulting in micrometric or sub micrometric particulate morphologies. Surprisingly, the mechanical and thermal properties of the resulting resin are maintained or even improved.

The Polyarylethersulphone Thermoplastic Polymer (A)

The polyarylethersulphone thermoplastic polymer (A) comprises ether-linked repeating units, optionally further comprising thioether-linked repeating units, the units being selected from:

and optionally from:

wherein:
Ar is phenylene;
n=1 to 2 and can be fractional;
a=1 to 3 and can be fractional and when a exceeds 1, said phenylene groups are linked linearly through a single chemical bond or a divalent group other than —$SO_2$— (preferably wherein the divalent group is a group —$C(R^9)_2$— wherein each $R^9$ may be the same or different and selected from H and $C_{1-8}$ alkyl (particularly methyl)), or are fused together, provided that the repeating unit —[$ArSO_2Ar$]$_n$— is always present in the polyarylethersulphone in such a proportion that on average at least two of said —[$ArSO_2Ar$]$_n$— units are in sequence in each polymer chain present,
and wherein the polyarylethersulphone has one or more reactive pendant and/or end group(s).

By "fractional" reference is made to the average value for a given polymer chain containing units having various values of n or a.

In one embodiment, the phenylene groups in the polyarylethersulphones are linked through a single bond.

The phenylene groups in the polyarylethersulphones may be substituted by one or more substituent groups, each independently selected from $C_{1-8}$ branched or straight chain aliphatic saturated or unsaturated aliphatic groups or moieties optionally comprising one or more heteroatoms selected from O, S, N, or halo (for example Cl or F); and/or groups providing active hydrogen especially OH, $NH_2$, $NHR^a$ or —SH, where $R^a$ is a hydrocarbon group containing up to eight carbon atoms, or providing other cross-linking activity especially benzoxazine, epoxy, (meth)acrylate, cyanate, isocyanate, acetylene or ethylene, as in vinyl, allyl or maleimide, anhydride, oxazoline and monomers containing unsaturation.

Preferably, the phenylene groups are meta- or para- (preferably para). A mixture of conformations (particularly meta- and para-conformations) may be present along the polymer backbone.

Preferably the polyarylethersulphone comprises a combination of —[$ArSO_2Ar$]$_n$— and —[$Ar$]$_a$— repeating units, linked by ether and/or thio-ether linkages, preferably by ether linkages. Thus, preferably the polyarylethersulphone comprises a combination of polyethersulphone (PES) and polyetherethersulphone (PEES) ether-linked repeating units.

The relative proportions of —[$ArSO_2Ar$]$_n$— and —[$Ar$]$_a$— repeating units is such that on average at least two —[$ArSO_2Ar$]$_n$— repeating units are in immediate mutual succession in each polymer chain present, and the ratio of —[$ArSO_2Ar$]$_n$— units to —[$Ar$]$_a$-units is preferably in the range 1:99 to 99:1, more preferably 10:90 to 90:10. Typically, the ratio [$ArSO_2Ar$]$_n$:[$Ar$]$_a$ is in the range 75:25 to 50:50.

In one embodiment, the preferred repeating units in the polyarylethersulphones are:

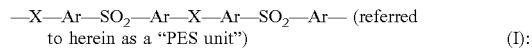

and

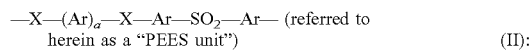

wherein:
X is O or S (preferably O) and may differ from unit to unit; and
the ratio of units I:II is preferably in the range of from 10:90 to 80:20, more preferably in the range of from 10:90 to 55:45, more preferably in the range of from 25:75 to 50:50, and in one embodiment, the ratio I:II is in the range of from 20:80 to 70:30, more preferably in the range of from 30:70 to 70:30, most preferably in the range of from 35:65 to 65:35.

The preferred relative proportions of the repeating units of the polyarylethersulphone may be expressed in terms of the weight percent $SO_2$ content, defined as 100 times (weight of $SO_2$)/(weight of average repeat unit). The preferred $SO_2$ content is at least 22, preferably 23 to 25%. When a=1 this corresponds to PES/PEES ratio of at least 20:80, preferably in the range 35:65 to 65:35.

The flow temperature of polyetherethersulphone is generally less than that of a corresponding Mn polyethersulphone, but both possess similar mechanical properties. Accordingly the ratio may be determined, by determining values for a and n above. U.S. Pat. No. 6,437,080 discloses processes for obtaining such compositions from their monomer precursors in a manner to isolate the monomer precursors in selected molecular weight as desired, and those disclosures are incorporated herein by reference.

The above proportions refer only to the units mentioned. In addition to such units the polyarylethersulphone may contain up to 50% molar, preferably up to 25% molar, of other repeating units: the preferred $SO_2$ content ranges then apply to the whole polymer. Such units may be for example of the formula:

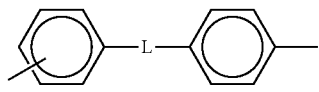

in which L is a direct link, oxygen, sulphur, —CO— or a divalent group (preferably a divalent hydrocarbon radical, preferably wherein the divalent group is a group —C(R$^{12}$)$_2$— wherein each R$^{12}$ may be the same or different and selected from H and C$_{1-8}$ alkyl (particularly methyl)).

When the polyarylethersulphone is the product of nucleophilic synthesis, its units may have been derived for example from one or more bisphenols and/or corresponding bis-thiols or phenol-thiols selected from hydroquinone, 4,4'-dihydroxybiphenyl, resorcinol, dihydroxynaphthalene (2,6 and other isomers), 4,4'-dihydroxybenzophenone, 2,2'-di(4-hydroxyphenyl)propane and -methane. If a bis-thiol is used, it may be formed in situ, that is, a dihalide may be reacted with an alkali sulphide or polysulphide or thiosulphate.

Other examples of such additional units are of the formula:

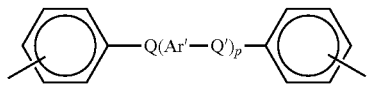

in which Q and Q', which may be the same or different, are CO or SO$_2$; Ar' is a divalent aromatic radical; and p is 0, 1, 2, or 3, provided that p is not zero where Q is SO$_2$. Ar' is preferably at least one divalent aromatic radical selected from phenylene, biphenylene or terphenylene. Particular units have the formula:

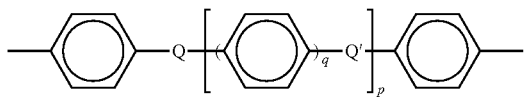

where q is 1, 2 or 3. When the polymer is the product of nucleophilic synthesis, such units may have been derived from one or more dihalides, for example selected from 4,4'-dihalobenzophenone, 4,4'bis(4-chlorophenylsulphonyl) biphenyl, 1,4,bis(4-halobenzoyl)benzene and 4,4'-bis(4-halobenzoyl)biphenyl. They may of course have been derived partly from the corresponding bisphenols.

The polyarylethersulphone may be the product of nucleophilic synthesis from halophenols and/or halothiophenols. In any nucleophilic synthesis the halogen if chlorine or bromine may be activated by the presence of a copper catalyst. Such activation is often unnecessary if the halogen is activated by an electron withdrawing group. In any event, fluoride is usually more active than chloride. Any nucleophilic synthesis of the polyarylethersulphone is carried out preferably in the presence of one or more alkali metal salts, such as KOH, NaOH or K$_2$CO$_3$ in up to 10% molar excess over the stoichiometric.

As noted above, the polyarylethersulphone contains one or more reactive pendant and/or end-group(s), and in a preferred embodiment the polyarylethersulphone contains two such reactive pendant and/or end-group(s). In one embodiment, the polyarylethersulphone comprises one such reactive pendant- and/or end-group. Preferably, the reactive pendant- and/or end-groups are groups providing active hydrogen, particularly OH, NH$_2$, NHR$^b$ or —SH (where R$^b$ is a hydrocarbon group containing up to eight carbon atoms), or are groups providing other cross-linking activity, particularly benzoxazine, epoxy, (meth)acrylate, cyanate, isocyanate, acetylene or ethylene, as in vinyl, allyl or maleimide, anhydride, oxazaline and monomers containing saturation.

In one embodiment, the reactive pendant- and/or end-groups are of formula -A'-Y wherein A' is a bond or a divalent hydrocarbon group, preferably aromatic, preferably phenyl. Examples of Y are groups providing active hydrogen, particularly OH, NH$_2$, NHR$^b$ or —SH (where R$^b$ is a hydrocarbon group containing up to eight carbon atoms), or groups providing other cross-linking activity, particularly benzoxazine, epoxy, (meth)acrylate, cyanate, isocyanate, acetylene or ethylene, as in vinyl, allyl or maleimide, anhydride, oxazaline and monomers containing saturation. The groups providing other cross-linking activity may be bound to the Ar groups of the polyarylethersulphone via a direct bond, or via an ether, thioether, sulphone, —CO— or divalent hydrocarbon radical linkage as described hereinabove, most typically via an ether, thioether or sulphone linkage. In a further embodiment, the end-groups, but preferably no more than a relatively minor proportion thereof, may be selected from halo groups (particularly chloro). Reactive end-groups may be obtained by a reaction of monomers or by subsequent conversion of product polymers prior to, or subsequently to, isolation. In one method for the introduction of reactive pendant and/or end-groups, for instance using activated aromatic halogenides (e.g. dichlorodiphenylsulphone) as the starting material for the polymer, the synthetic process utilises a slightly more than stoichiometric amount of the activated aromatic halogenide, and the resulting polymer having terminal halogenate groups is then reacted with an aminophenol (e.g. m-aminophenol) to create amino end groups.

The reactive pendant- and/or end-group(s) is/are preferably selected from groups providing active hydrogen, particularly OH and NH$_2$, particularly NH$_2$. Preferably, the polymer comprises two such groups.

The number average molar mass M$_n$ of the polyarylethersulphone is suitably in the range from about 2,000 to about 30,000, preferably from about 2,000 to about 25,000, preferably from about 2,000 to about 15,000, and in one embodiment from about 3,000 to about 10,000 g/mol.

The synthesis of the polyarylethersulphone is further described in US-2004/0044141 and U.S. Pat. No. 6,437,080, and those disclosures are incorporated herein by reference.

The Conductive Nano Filler

The term "conductive nano-filler", as used herein, includes but is not limited to components referred to in the art as carbon nano-tubes (CNTs), including single-wall carbon nano-tubes (SWCNTs), double-walled carbon nano-tubes (DWCNTs) and multi-wall carbon nanotubes (MW-CNTs), carbon nano-particles, carbon nano-fibres, carbon nano-ropes, carbon nano-ribbons, carbon nano-fibrils, carbon nano-needles, carbon nano-sheets, carbon nano-rods, carbon nano-cones, carbon nano-scrolls and carbon nano-ohms, as well as the corresponding boron nitride components. In one embodiment, the term "conductive nano-filler" refers to carbon-based conductive nano-fillers, and includes but is not limited to the carbon-based components described hereinabove. The term "conductive nano-filler" further includes graphite nano-platelets or nano-dots, chopped/short carbon fibers, carbon black or a combination thereof with or without a partial or total metallic coating or other fullerene materials and combinations thereof.

The carbon nanotubes may be of any chirality. The carbon nanotubes may be armchair nanotubes. The nanotubes may be semiconducting nanotubes or any other type that displays electrical conductivity.

Carbon nano-tubes may be produced by chemical vapor deposition (CVD), catalytic chemical vapour deposition (CCVD), carbon catalyst vapor deposition (CCVD), high pressure carbon monoxide process (HiPco), arc discharge, laser vaporization or other methods known to those of ordinary skill in the art may also be used in the processes of the present invention.

The preferred nano-filler of the invention is the carbon nano-tube, particularly the multi-wall carbon nano-tube. Typically, carbon nano-tubes are tubular, strand-like structures having external diameters in the range of from about 0.4 nm to about 100 nm. Preferably the external diameter is no more than about 50 nm, preferably no more than about 25 nm, and in one embodiment no more than about 15 nm. Preferably the external diameter is at least about 1 nm, and in one embodiment at least about 5 nm.

The conductive nano-filler preferably has an aspect ratio of no more than 10000:1, preferably no more than 1000:1. Preferably the conductive nano-filler has an aspect ratio of at least 100:1. The term aspect ratio used herein is understood to refer to the ratio of the longest dimension to the shortest dimension of the three dimensional body.

The Thermosetting Polymeric Matrix

As used herein, a "curable polymer composition" refers to a composition prior to curing and a "thermoset resin composition" refers to a post-cured composition.

In a third aspect of the present invention, there is provided a thermoset resin system or curable polymer composition comprising one or more conductive nano-filler(s), one or more polyarylethersulphone thermoplastic polymer(s) (A) and one or more uncured thermoset resin precursor(s) (P), and optionally one or more curing agent(s) therefor.

In a preferred embodiment, the thermoset resin system or curable polymer composition of the third aspect of the invention comprises the polyarylethersulphone-wrapped nano-filler composition according to the first aspect of the invention defined herein and one or more uncured thermoset resin precursor(s) (P), and optionally one or more curing agent(s) therefor.

As noted above, it is preferred that at least a portion of the conductive nano-filler must be dispersed in, or coated or wrapped with, the thermoplastic polymer prior to mixing or contacting with the thermosetting resin precursor(s). Thus, the compositions of the third aspect of the invention may be obtained by:

(i) mixing or dispersing a conductive nano-filler with or into a composition comprising one or more polyarylethersulphone thermoplastic polymer(s) (A) and one or more uncured thermoset resin precursor(s) (P), and optionally one or more curing agent(s) therefor; or (ii) in a preferred embodiment, mixing or dispersing a composition according to the first aspect of the invention with or into one or more uncured thermoset resin precursor(s) (P), and optionally one or more curing agent(s) therefor; or (iii) in a further preferred embodiment, mixing or dispersing a composition according to the first aspect of the invention with or into a composition comprising one or more uncured thermoset resin precursor(s) (P) and further comprising one or more polyarylethersulphone(s) as defined herein (the same as or different to the polyarylethersulphone(s) in the composition of the first aspect) and one or more conductive nano-filler(s) as defined herein (the same as or different to the nano-filler in the composition of the first aspect), and optionally one or more curing agent(s) therefor.

Where a curing agent is present, the composition of the third aspect of the invention is preferably obtained by addition of the curing agent(s) after the mixing of said one or more uncured thermoset resin precursor(s) (P), one or more polyarylethersulphone(s) and conductive nano-filler(s).

In a fourth aspect of the invention, there is provided a cured thermoset resin composition (R) derived from the composition as defined for the third aspect of the invention comprising one or more conductive carbon-based nano-filler(s), one or more polyarylethersulphone thermoplastic polymer(s) (A) and one or more uncured thermoset resin precursor(s) (P), and optionally one or more curing agent(s) therefor.

In a preferred embodiment, the composition of the fourth aspect of the invention is derived from a composition comprising polyarylethersulphone-wrapped nano-filler defined herein and one or more uncured thermoset resin precursor(s) (P), and optionally one or more curing agent(s) therefor.

During processing the thermoplastic dissolves into the resin system prior to the resin system gelling point, and provides a well-dispersed network of nano-filler at the molecular level without re-agglomeration. This network provides a significant increase in the electrical conductivity and permittivity of the resin matrix and the composite material formed using this matrix.

The present invention is primarily concerned with thermoset epoxy resins derived from one or more epoxy resin precursor(s). The epoxy resin precursor preferably has at least two epoxide groups per molecule, and may be a polyfunctional epoxide having three, four, or more epoxide groups per molecule. The epoxy resin precursor is suitably liquid at ambient temperature. Suitable epoxy resin precursors include the mono- or poly-glycidyl derivative of one or more of the group of compounds consisting of aromatic diamines, aromatic monoprimary amines, aminophenols, polyhydric phenols, polyhydric alcohols, polycarboxylic acids and the like, or a mixture thereof.

Preferred epoxy resin precursors are selected from:
(i) glycidyl ethers of bisphenol A, bisphenol F, dihydroxydiphenyl sulphone, dihydroxybenzophenone, and dihydroxy diphenyl;
(ii) epoxy resins based on Novolacs; and
(iii) glycidyl functional reaction products of m- or p-aminophenol, m- or p-phenylene diamine, 2,4-, 2,6- or 3,4-toluoylene diamine, 3,3'- or 4,4'-diaminodiphenyl methane, particularly wherein the epoxy resin precursor has at least two epoxide groups per molecule.

Particularly preferred epoxy resin precursors are selected from the diglycidyl ether of bisphenol A (DGEBA); the diglycidyl ether of bisphenol F (DGEBF); O,N,N-triglycidyl-para-aminophenol (TGPAP); O,N,N-triglycidyl-meta-aminophenol (TGMAP); and N,N,N',N'-tetraglycidyl-diaminodiphenyl methane (TGDDM). In one embodiment, epoxy resin precursors are selected from DGEBA and DGEBF. In a preferred embodiment, epoxy resin precursors are selected from DGEBF and TGPAP and blends thereof.

The epoxy group to amino hydrogen equivalent ratio is preferably in the range from 1.0 to 2.0. Formulations displaying an excess of epoxy are preferred to the exact stoichiometry.

Commercially available epoxy resin precursors suitable for use in the present invention include N,N,N',N'-tetraglycidyl diamino diphenylmethane (e.g. grades MY 9663, MY 720 or MY 721; Huntsman); N,N,N',N'-tetraglycidyl-bis(4-aminophenyl)-1,4-diisopropylbenzene (e.g. EPON 1071; Momentive); N,N,N',N'-tetraclycidyl-bis(4-amino-3,5-dimethylphenyl)-1,4-diisopropylbenzene, (e.g. EPON 1072; Momentive); triglycidyl ethers of p-aminophenol (e.g. MY 0510; Hunstman); triglycidyl ethers of m-aminophenol (e.g. MY 0610; Hunstman); diglycidyl ethers of bisphenol A based materials such as 2,2-bis(4,4'-dihydroxy phenyl)propane (e.g. DER 661 (Dow), or EPON 828 (Momentive) and Novolac resins preferably of viscosity 8-20 Pa s at 25° C.; glycidyl ethers of phenol Novolac resins (e.g. DEN 431 or DEN 438; Dow); di-cyclopentadiene-based phenolic Novolac (e.g. Tactix 556, Huntsman); diglycidyl 1,2-phthalate (e.g. GLY CEL A-100); diglycidyl derivative of dihydroxy diphenyl methane (Bisphenol F) (e.g. PY 306; Huntsman). Other epoxy resin precursors include cycloaliphatics such as 3',4'-epoxycyclohexyl-3,4-epoxycyclohexane carboxylate (e.g. CY 179; Huntsman).

In one embodiment of the present invention, the thermoset resin system or curable polymer composition comprises a blend of epoxy resin precursors having the same or different functionality (wherein the term "functionality" in this context means the number of functional epoxide groups). The blend of epoxy resin precursors may comprise one or more epoxy resin precursors having two epoxide groups per molecule (hereinafter referred to as precursor(s) P2), and/or one or more epoxy resin precursors having three epoxide groups per molecule (hereinafter referred to as precursor(s) P3), and/or one or more epoxy resin precursors having four epoxide groups per molecule (hereinafter referred to as precursor(s) P4). The blend may also comprise one or more epoxy resin precursors having more than four epoxide groups per molecule (hereinafter referred to as precursor(s) PP). In one embodiment, only P3 precursor(s) may be present. In an alternative embodiment, only P4 precursor(s) may be present. In one embodiment, a blend of epoxy resin precursors comprises:
(i) from about 0 wt % to about 60 wt % of epoxy resin precursor(s) (P2);
(ii) from about 0 wt % to about 55 wt % of epoxy resin precursor(s) (P3); and
(iii) from about 0 wt % to about 80 wt % of epoxy resin precursor(s) (P4).

In one embodiment, the blend comprises only one epoxy resin precursor of a given functionality, in the proportions noted above.

The thermoset resin system or curable polymer composition of the invention are thermally curable. The addition of curing agent(s) and/or catalyst(s) is optional, but the use of such may increase the cure rate and/or reduce the cure temperatures, if desired. In a preferred embodiment, one or more curing agent(s) are used, optionally with one or more catalyst(s). In an alternative embodiment, the thermoset resin system or curable polymer composition described herein are thermally cured without the use of curing agents or catalysts.

Preferably, however, the thermoset resin system or curable polymer composition comprises one or more curing agent(s). The curing agent is suitably selected from known curing agents, for example as disclosed in EP-A-0311349, EP-A-0486197, EP-A-0365168 or in U.S. Pat. No. 6,013,730, which are incorporated herein by reference, such as an amino compound having a molecular weight up to 500 per amino group, for example an aromatic amine or a guanidine derivative. An aromatic amine curing agent is preferred, preferably an aromatic amine having at least two amino groups per molecule, and particularly preferably diaminodiphenyl sulphones, for instance where the amino groups are in the meta- or in the para-positions with respect to the sulphone group. Particular examples are 3,3'- and 4-,4'-diaminodiphenylsulphone (DDS); methylenedianiline; bis (4-amino-3,5-dimethylphenyl)-1,4-diisopropylbenzene; bis (4-aminophenyl)-1,4-diisopropylbenzene; 4,4'methylenebis-(2,6-diethyl)-aniline (MDEA; Lonza); 4,4'methylenebis-(3-chloro, 2,6-diethyl)-aniline (MCDEA; Lonza); 4,4'methylenebis-(2,6-diisopropyl)-aniline (M-DIPA; Lonza); 3,5-diethyl toluene-2,4/2,6-diamine (D-ETDA 80; Lonza); 4,4'methylenebis-(2-isopropyl-6-methyl)-aniline (M-MIPA; Lonza); 4-chlorophenyl-N,N-dimethyl-urea (e.g. Monuron); 3,4-dichlorophenyl-N,N-dimethyl-urea (e.g. Diuron™) and dicyanodiamide (Amicure™ CG 1200; Pacific Anchor Chemical). Bisphenol chain extenders, such as bisphenol-S or thiodiphenol, are also useful as curing agents for epoxy resins. Particularly preferred for use in the present invention are 3,3'- and 4-,4'-DDS. Suitable curing agents also include anhydrides, particularly polycarboxylic anhydrides, such as nadic anhydride, methylnadic anhydride, phthalic anhydride, tetrahydrophthalic anhydride, hexahydrophthalic anhydride, methyltetrahydrophthalic anhydride, endomethylenetetrahydrophtalic anhydride, or trimellitic anhydride.

In one embodiment, the thermoset resin system or curable polymer composition comprises one or more catalyst(s) to accelerate the curing reaction. Suitable catalysts are well known in the art and include Lewis acids or bases. Specific examples include compositions comprising boron trifluoride, such as the etherates or amine adducts thereof (for instance the adduct of boron trifluoride and ethylamine), particularly where epoxy resin precursors are used in conjunction with the aforementioned amine curing agents.

The curable polymer composition may comprise a curing agent and catalyst, for instance as disclosed in U.S. Pat. No. 6,265,491, the contents of which are incorporated herein by reference.

The amount of thermoplastic polymer (A) combined with or added to the resin precursor is preferably such that the mass fraction $w(A)$, calculated as $w(A)=m(A)/m$, where $m(A)$ is the mass of the thermoplastic polymer (A) present in the cured thermoset resin composition having the mass m, of from 0.5% to 40%, preferably from 1% to 35%, and more preferably from 2% to 30%.

The curing agent is typically present at about 1-60% by weight of the total combined weight of the thermoset resin precursor(s) plus curing agent in the composition, preferably about 20-50% by weight, typically about 25-40% by weight.

Thus, the present invention provides a process for the preparation of cured thermoset resin compositions (R) said process comprising the steps of
(i) preparation of thermoplastic-wrapped nano-fillers, as described herein;
(ii) mixing and/or dissolving said thermoplastic-wrapped nano-fillers with one or more uncured thermoset resin precursor(s) (P), as described herein; and
(iii) curing the mixture, for instance by dissolving/dispersing in curing agent/catalyst at reduced temperature and then effecting the cure.

Applications

The compositions described herein can be used to manufacture cast or moulded structural materials, and are particularly suitable for fabrication of fibre-reinforced load-bearing or impact-resisting composite structures. The compositions may be used neat, or as composite materials reinforced with fibres or fillers. In some embodiments the composition can be used to improve composite z-direction electrical conductivity; in some other embodiments the composition can be used to impart signature control characteristics to composite structures.

Thus, according to a further aspect of the invention there is provided a moulded or cast article either comprising the thermoset resin compositions defined herein or derivable from the curable polymer compositions defined herein.

According to a further aspect of the invention there is provided a composite material comprising, or derivable from, the thermoset resin compositions or curable polymer compositions described hereinabove, particularly wherein the composite material is, or comprises, a pre-preg.

Moulded products are obtainable from the compositions of the present invention by the general steps of mixing the thermoplastic-wrapped conductive nano-fillers with one or more uncured thermoset resin precursor(s) (P), adding curing agent and catalyst as required, homogenising the mixture thus obtained, casting the mixture into a mould to obtain a moulded product, and curing the moulded product at an elevated temperature of at least 100° C. to form a cured moulded product.

In one preferred embodiment, particularly for the fabrication of load-bearing or impact-resisting structures, the compositions are composite materials further comprising reinforcing agent(s) such as fibres or fillers.

Fibres can be added short or chopped typically of mean fibre length not more than about 2 cm, and typically at least about 0.1 mm, for example about 6 mm. Alternatively, and preferably, the fibres are continuous and may, for example, be uni-directionally disposed fibres or woven fabric or braided, knitted or non-woven fabrics to form a pre-preg. As used herein, the term "pre-preg" refers to pre-impregnated and non-cured fibre-reinforced composite materials. A pre-preg typically comprises continuous fibres, but combinations of both short and/or chopped fibres and continuous fibres may be utilised. For some applications, the pre-preg fibres can be selected from short and/or chopped uni-directional fibres alone. The fibrous reinforcement may be selected from hybrid or mixed fibre systems which comprise synthetic or natural fibres, or a combination thereof.

Fibres may be sized or unsized. Fibres can be added typically at a concentration of 5 to 35, preferably at least 20%, by weight. For structural applications, it is preferred to use continuous fibre for example glass or carbon, especially at 30 to 70, more especially 50 to 70% by volume.

The fibre can be organic, such as aramid fibres, metallised polymer fibres (where the polymer can be soluble or insoluble in the resin matrix), poly paraphenylene terephthalamide fibres or inorganic or a combination thereof. Among inorganic fibres, glass fibres such as "E", "A", "E-CR", "C", "D", "R", "S" or quartz fibres can be used, or alumina, zirconia, silicon carbide, metallised glass, other compound ceramics or metals. A very suitable reinforcing fibre is carbon, especially as graphite. Graphite or carbon fibers may also be metallised (with discontinuous or continuous metal layers). Graphite fibres which have been found to be especially useful in the invention are those supplied by Cytec under the trade designations T650-35, T650-42 and T300; those supplied by Toray under the trade designation T800-HB; and those supplied by Hexcel under the trade designations AS4, AU4, IM 8 and IM 7.

Organic or carbon fibre is preferably unsized or is sized with a material that is compatible with the composition according to the invention, in the sense of being soluble in the liquid precursor composition without adverse reaction or of bonding both to the fibre and to the thermoset/thermoplastic compositions described herein. In particular, carbon or graphite fibres that are unsized or are sized with resin precursor or polyarylethersulphone are preferred. Inorganic fibre preferably is sized with a material that bonds both to the fibre and to the polymer composition; examples are the organo-silane coupling agents applied to glass fibre.

The polyarylethersulphone thermoplastic polymer (A) defined hereinabove functions as both a compatibiliser for the conductive nano-fillers in the thermoset resin and a toughening agent for the thermoset resin. The compositions described herein may further contain additional toughening agents such as homoploymers or copolymers either alone or in combination of polyamides, copolyamides, polyimides, aramids, polyketones, polyetherketones (PEK), polyetheretherketones (PEEK), polyetherketoneketone (PEKK), polyesters, polyurethanes, polysuphones, polysuphides, polyphenylene oxide (PPO) and modified PPO, poly(ethylene oxide) (PEO) and polypropylene oxide, polystyrenes, polybutadienes, polyacrylates, polymethacrylates, polyacrylics, polyphenylsulfone, high performance hydrocarbon polymers, liquid crystal polymers, elastomers and segmented elastomers and the polyarylethersulphones defined hereinabove, particulate toughening agents, for instance preformed particles such as, polymeric particles, ceramic particles, carbon particles, glass beads, metal and metal alloy particles, rubber particles and rubber-coated glass beads, filler such as polytetrafluoroethylene, alumina, silica, calcium carbonate, calcium oxide, graphite, boron nitride, mica, talc and vermiculite, pigments/dyes, nucleating agents, wetting agents, viscosity modifiers/flow control agents, flame retardants, plasticizers, UV absorbers, antifungal compounds, tackifiers, inhibitors and stabilisers such as phosphates. Liquid rubbers having reactive groups may also be used. The total of such materials and any fibrous reinforcing agent in the composition is typically at least 20% by volume, as a percentage of the total volume of the composition. The percentages of fibres and such other materials are calculated on the total composition after reaction or processing at the hereinbelow defined temperatures. In one embodiment, the toughening agents present in the composition comprise and preferably consist of high-Tg engineering thermoplastics, preferably the polyarylethersulphone thermoplastic polymers defined hereinabove.

The composites are obtained from a curable polymer composition made by combining the components of the curable polymer compositions described hereinabove with fibrous reinforcing agent and/or other materials. For instance, the manufacture of a pre-preg typically comprises the steps of mixing the thermoplastic-wrapped nano-fillers and the uncured thermoset resin precursor(s) (P), adding a curing agent and catalyst as required, homogenising the mixture thus obtained, and applying the homogenised mixture to a bundle or strand of parallel aligned fibres or fibre weaves or braided or knitted or non-woven fabrics to form the pre-preg. A solvent may be present to aid processing. The solvent and the proportion thereof are chosen so that the mixture of the components forms at least a stable emulsion, preferably a stable apparently single-phase solution. Typically a mixture of solvents is used, for example of a halogenated hydrocarbon and an alcohol, in a ratio suitably in the range 99:1 to 85:15. Conveniently the solvents in such a mixture should boil at under 100° C. at 1 atm pressure and should be mutually miscible in the proportions used. Alternatively the components can be brought together by hot melting and/or high shear. The mixture is stirred until sufficiently homogeneous. Thereafter any solvent is removed by evaporation. Evaporation is suitably at 50-200° C. and, at least in its final stages, can be at sub-atmospheric pressure, for example in the range 13.33 Pa to 1333 Pa (0.1 to 10 mm Hg). The composition preferably contains up to 5% w/w of volatile solvent, to assist flow when used to impregnate fibres. This residual solvent will be removed in contact with the hot rollers of the impregnating machine.

More specifically, fabrication of articles and composites from the compositions of the present invention is as follows. The composition in the form of a resin solution is transferred onto a suitable mould or tool for preparation of a panel, prepreg or the like, the mould or tool having been preheated to a desired degassing temperature. The stable emulsion is combined with any reinforcing, toughening, filling, nucleating materials or agents or the like, and the temperature is raised to initiate curing thereof. Suitably curing is carried out at elevated temperature up to 200° C., preferably in the range of 160 to 200° C., more preferably at about 170-190° C., and with use of elevated pressure to restrain deforming effects of escaping gases, or to restrain void formation, suitably at pressure of up to 10 bar, preferably in the range of 3 to 7 bar abs. Suitably the cure temperature is attained by heating at up to 5° C./min. for example 2° C. to 3° C./min and is maintained for the required period of up to 9 hours, preferably up to 6 hours, for example 2 to 4 hours. The use of a catalyst may allow even lower cure temperatures. Pressure is released throughout and temperature reduced by cooling at up to 5° C./min. for example up to 3° C./min. Post-curing at temperatures in the range of 190° C. to 200° C. may be performed, at atmospheric pressure, employing suitable heating rates to improve the glass transition temperature of the product or otherwise. The mould or tool may be constructed of any suitable material, for instance an unsaturated polyester or thermoset resin such as epoxy or bis-maleimides having a heat resistance in excess of the forming temperature to be employed. Reinforcement is suitably provided in the form of glass fibres. Composite moulds may be prepared in a conventional manner.

The composition, possibly containing some volatile solvent already present or newly added, can be used for example as an adhesive or for coating surfaces or for making solid structures by casting possibly in a foamed state. Short fibre reinforcement may be incorporated with composition prior to curing thereof. Preferably a fibre-reinforced composition is made by passing essentially continuous fibre into contact with such resin composition. The resulting impregnated fibrous reinforcing agent may be used alone or together with other materials, for example a further quantity of the same or a different polymer or resin precursor or mixture, to form a shaped article. This technique is described in more detail in EP-A-56703, 102158 and 102159.

A further procedure comprises forming incompletely cured composition into film by, for example, compression moulding, extrusion, melt-casting or belt-casting, laminating such films to fibrous reinforcing agent in the form of, for example, a non-woven mat of relatively short fibres, a woven cloth or essentially continuous fibre in conditions of temperature and pressure sufficient to cause the mixture to flow and impregnate the fibres and curing the resulting laminate.

Plies of impregnated fibrous reinforcing agent, especially as made by the procedure of one or more of EP-A 56703, 102158, 102159, can be laminated together by heat and pressure, for example by autoclave, vacuum or compression moulding or by heated rollers, at a temperature above the curing temperature of the thermosetting resin or, if curing has already taken place, above the glass transition temperature of the mixture, conveniently at least 180° C. and typically up to 200° C., and at a pressure in particular in excess of 1 bar, preferably in the range of 1-10 bar.

The resulting multi-ply laminate may be anisotropic in which the fibres are continuous and unidirectional, orientated essentially parallel to one another, or quasi-isotropic in each ply of which the fibres are orientated at an angle, conveniently 45° as in most quasi-isotropic laminates but possibly for example 30° or 60° or 90° or intermediately, to those in the plies above and below. Orientations intermediate between anisotropic and quasi-isotropic, and combination laminates, may be used. Suitable laminates contain at least 4 preferably at least 8, plies. The number of plies is dependent on the application for the laminate, for example the strength required, and laminates containing 32 or even more, for example several hundred, plies may be desirable. There may be aggregates, as mentioned above in interlaminar regions. Woven fabrics are an example of quasi-isotropic or intermediate between anisotropic and quasi-isotropic.

The curable polymer composition is suitably adapted to be cured at a temperature less than that at which the material constituting the mould or tool on or in which it is intended to cure the resin composition becomes heat-sensitive in any way.

According to a further aspect of the invention, there is provided a method for the manufacture of a thermoset resin composition comprising disposing the curable polymer composition as defined herein in a suitable mould or tool, or equivalent state in which it is to be formed, subjecting the composition to the desired elevated temperature at suitable pressure, for example at atmospheric pressure, and maintaining the temperature for a required period, as hereinbefore defined.

According to a further aspect of the invention, there is provided a composite comprising pre-pregs as defined herein laminated together by heat and pressure, for example by autoclave, compression moulding, or by heated rollers, at a temperature above the curing temperature of the polymer composition.

According to a further aspect of the invention there is provided a radar-absorbing composite, having absorbing capability in one or more radar frequency bands in the 1-40 GHz range, said radar-absorbing composite comprising one or more layers comprising the resin compositions defined herein or derivable from the curable polymer compositions defined herein. As defined herein, the radar frequency bands are selected from one or more of: L band (1-2 GHz), S band (2-4 GHz), C band (4-8 GHz), X band (8-12 GHz), Ku band (12-18 GHz), K band (18-26.5 GHz) and Ka band (26.5-40 GHz). In one embodiment of the present invention, there is provided a radar-absorbing composite able to absorb radar in the X band.

As defined herein each layer may derive from different curable polymer compositions or may have different fibre reinforcements or fillers. Each layer may be a single ply laminate or a multi-ply laminate as defined herein.

Figure 2:
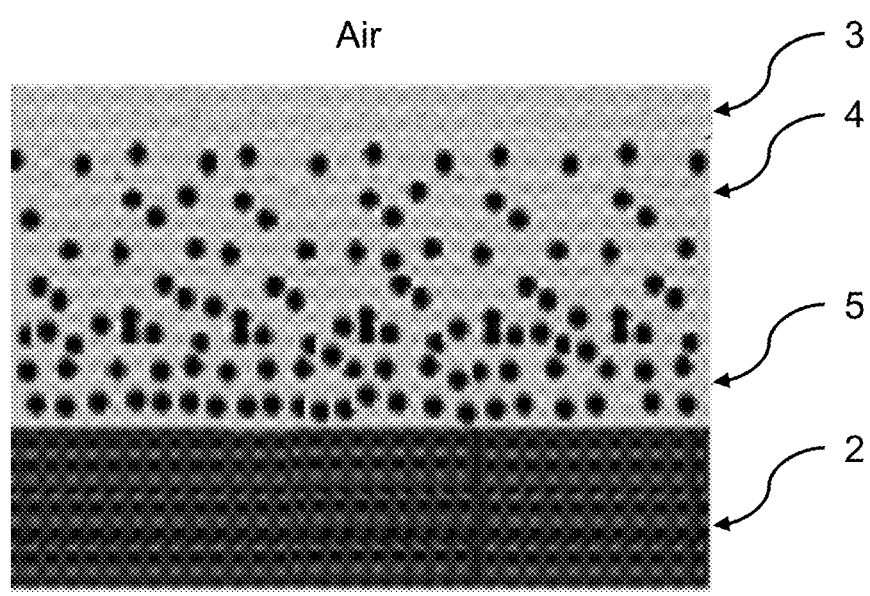

The radar absorbing composite may be a single absorber layer 1 which is designed to have tailored complex permittivity and thickness to reduce/minimize the electromagnetic reflection in the selected frequency range (FIG. 1), or may be a multi-layer absorber, as example layers 3, 4, 5 (FIG. 2) comprising the resin compositions defined herein or derivable from the curable polymer compositions defined herein. The multilayer absorber may for example include a layer 3 having low dielectric constant and a series of layers 4, 5 with increasing complex permittivity values along the absorber orthogonal direction. Each layer of the absorber may comprise the thermoset resin compositions defined herein and different nano-filler contents.

The compositions may be used neat, or as composite materials reinforced with fibres or fillers. The fibrous reinforcement preferably comprises fibres having low dielectric constant such as quartz or glass type such "E", "A", "E-CR", "C", "D", "R" and "S" glass. The fibres may be continuous or may, for example, be uni-directionally disposed fibres or woven fabric or braided, knitted or non-woven fabrics to form a pre-preg or may be in the form of mat, textile or veil or the like. In one embodiment of the present invention, an Astroquartz woven fabric can be used.

The compositions may further comprise magnetic fillers to provide improved absorbing capability or to further reduce the radar-absorbing material thickness, said magnetic fillers comprising metallic magnetic microparticles such as carbonyl iron powder, ferrites and hexaferrites, metallic magnetic nanoparticles and nanocrystals.

According to a further aspect of the present invention there is provided a radar-absorbing panel having reduced radar cross-section in one or more radar frequency bands in the 1-40 GHz range, wherein said radar-absorbing panel comprises the radar-absorbing composite defined herein and a highly conductive substrate 2, wherein such highly conductive substrate is preferably a structural carbon fibre reinforced composite. Such structure is particularly suitable for fabrication of load-bearing or impact-resisting components having signature control characteristics and reduced radar cross-section.

The present invention is applicable to the manufacture of composites by conventional prepreg technology and also by resin infusion technology (as described for instance in US-2004/0041128). Resin infusion is a generic term which covers processing techniques such as Resin Transfer Molding (RTM), Liquid Resin Infusion (LRI), Vacuum Assisted Resin Transfer Molding (VARTM), Resin Infusion with Flexible Tooling (RIFT), Vacuum Assisted Resin Infusion (VARI), Resin Film Infusion (RFI), Controlled Atmospheric Pressure Resin Infusion (CAPRI), VAP (Vacuum Assisted Process) and Single Line Injection (SLI). The composites described herein particularly include composites formed through the use of resin-soluble thermoplastic veils in a resin infusion process as described in US-2006/0252334, the disclosure of which is incorporated herein by reference. In one embodiment, the composite is manufactured through resin infusion wherein a support structure comprising structural reinforcement fibers (dry) and the resin-soluble thermoplastic veil element is placed into a bag, mold or tool to provide a preform, a curable resin matrix composition is injected/infused directly into the combined structural reinforcement fibers and veil, and then cured.

According to a further aspect of the invention, there is provided a thermoplast, or a thermoplast-modified, thermoset resin shaped product comprising or derived from a composition, pre-preg or composite as hereinbefore defined, particularly one which is obtained by a method as hereinbefore defined.

The compositions of the present invention find utility in any field in which it is required to impart improved conductivity to a composite material. According to one embodiment of the present invention the improvement in conductivity is one order of magnitude or more relative to conventional carbon fibre reinforced materials. Greater improvements in conductivity may be imparted for composite materials that do not comprise a conductive reinforcement.

The compositions of the present invention find utility in any field in which it is required to tailor permittivity values in a selected frequency range or in which it is required to impart signature control capability to a composite component, or in which it is required to control the electromagnetic environment. For instance, the large radar cross-section and high tip speeds of wind turbine blades can affect radar systems used for air-traffic control, marine navigation and weather monitoring. Reducing the radar cross-section of wind turbine blades is therefore an important requirement of, for instance, wind-farms in the vicinity of airports, and off-shore installations. In addition, aircraft composite structures with reduced radar cross-section allow the control of electromagnetic wave propagation, and reduce scattering phenomena and disturbances to signals generated by on-board antennas. Furthermore, the compositions of the invention also find utility in composite structures for low-observable vehicles. The present invention enables the preparation of radar-absorbing composite materials and structures which require low radar cross-section.

The present invention is applicable to the manufacture of components suitable for use in transport applications (including aerospace, aeronautical, nautical and land vehicles, and including the automotive, rail and coach industries), including for instance primary and secondary aircraft structures and space and ballistics structures. Such structural components include composite wing structures. The present invention also finds utility in building/construction applications and in other commercial applications. As noted herein, the compositions of the present invention are particularly suitable for the fabrication of load-bearing or impact-resisting structures.

The invention is now illustrated in a non-limiting manner with reference to the following examples.

EXAMPLES

Measurement Methods

The compositions of the invention can be characterised using the methods described below.

Conductivity

Conductivity was determined for cured plaques and composites using a Burster-Resistomat 2316 milli-ohmmeter recording resistance values as the ratio between the applied voltage and current in a bridge method. Kelvin test Probes were used to create a contact between the two sample surfaces. All measurements were carried out in accordance with the 4-wire measurement method at RT in standard humidity conditions.

Resin system conductivity was measured on cured resin coupons extracted from flat, smooth and uniform plaque. Approximately 3 mm thick square coupons (side length=40 mm±0.1 mm) were characterized. A commercial silver paste was used to create two electrodes on opposite coupon surfaces.

Composite z-direction conductivity was measured on coupons extracted from defect free panels prepared in accordance with EN 2565 method B. Approximately 2 mm thick quasi-isotropic square samples (side length=40 mm±0.1 mm) were characterized.

Composite specimen surfaces were prepared by removing the top resin rich layer to expose the carbon fibers underneath ensuring a direct contact with the electrode. Then a commercial silver paste was used to create two electrodes on opposite coupon surfaces.

At least 5 samples per material and lay-up were tested.

DC electrical conductivity was calculated in [S/m] in according to the following equation:

$$\sigma_v = \frac{1}{R} \cdot \frac{l}{S}$$

where:
R is the measured resistance [Ohm];
l is the sample thickness [m];
S is the sample surface area [m$^2$]

Complex Permittivity in the 8-12 GHz Frequency Range

Electromagnetic data were determined on cured resin composition. Liquid resins were casted and cured in standard rectangular aluminium WR90 flanges having a thickness of 6 mm. The rectangular flanges containing the cured resin samples were then connected to a network analyzer Anritsu 37347C by means a wave-guide ATM WR90-120

A-666 and scanned in the 8 and 12 GHz frequency range. The effective complex relative permittivity $\in_{\mathit{eff}}$ is generally expressed in terms of its real and imaginary parts ($\in'$ and $\in''$, respectively). Real and imaginary parts of the permittivity in the 8-12 GHz frequency range were calculated from the measurements of the reflected signal, S11, and transmitted signal, S21 throughout the sample.

Radar Absorption in Free Space Conditions

The measurement of radar absorbing efficiency was performed on 40 cm×40 cm·square specimens The test set-up comprises a network analyzer Anritsu 37347C connected by means a standard rectangular wave-guide ATM WR90-120 A-666 to a horn antenna ATM 90-441-6. The antenna was positioned in front of the panel and used as emitter and receiver of the EM signal reflected from the panel in free space conditions. The reflection coefficient was calculated at each frequency using the following formula:

$$\Gamma_{dB}(f)=20*\log_{10}(\Gamma(f))$$

where $\Gamma=|\Gamma_p(f)/\Gamma_m(f)|$ is the ratio between the reflection coefficient $\Gamma_p(f)$ measured on the test panel and the reflection coefficient $\Gamma_m(f)$ measured on a reference metallic plate.

The frequency range between 8 and 12 GHz was scanned.

Morphology

Morphology was determined using Field Emission Gun-Scanning Electron Microscopy (FEG-SEM). Prior to SEM analysis, specimens were conditioned in liquid nitrogen for 5 minutes and fractured to obtain a clear fracture surface. The specimens were then coated with a gold film by means of a Quorum Technologies SC7620 sputter coater and examined by means of a LEO152 Gemini 1525 FEG-SEM. Observed morphologies analysed were classified either as homogeneous or as phase-separated. Where phase-separated, the morphology was classified as:

(i) macro-phase separation: the heterogeneity of the resin system is observable by eye. The resin is heterogeneous at the macro-scale.

(ii) micron-sized morphology: the resin is homogenous at the macro-scale, but a closer investigation by SEM displays heterogeneity at the micron-scale (particularly 1 to 100 μm).

(iii) sub-micrometric morphology: the resin is homogeneous at the macro-scale. A close investigation by SEM displays a secondary phase of dimension greater than 20 nm and up to 1 μm.

Micron-sized and sub-micrometric morphology may be classified depending on their structure as either:

(a) co-continuous: to describe a secondary phase forming with the thermoset matrix two fully intricate continuous phases (i.e. infinite clusters). The system could also be described as interpenetrated polymer networks (IPN).

(b) semi-continuous: to describe a secondary phase forming an interrupted continuous network (i.e. finite clusters) within a continuous thermoset matrix. The system could also be described as semi-interpenetrated polymer networks (semi-IPN).

(c) particulate: to describe a morphology in which the secondary phase is distributed into particles. The particles may be dispersed or aggregated forming a continuous network. A particulate morphology may also be described as an "islands-in-the-sea" structure where the sea corresponds to the continuous resin matrix and the islands to the particles.

Particle Size

Particle size distribution was measured using a Malvern Mastersizer 2000 operating in the 0.02 μm to 2000 μm range.

Glass Transition Temperature

The glass transition temperature is defined as the temperature where the sample exhibits a dramatic change in mechanical and damping behaviour with increasing temperature when subjected to an oscillating displacement. The Tg onset is defined as the temperature as the temperature intersection of extrapolated tangents drawn from points on the storage modulus curve before and after the onset of the glass transition event. The test was performed using TA Q800 in a single cantilever bending mode in the range of temperatures between about 50° C. and 300° C., with a heating rate of 5±0.2° C./min and 1 Hz frequency. Three specimens were tested and Tg results were within ±2° C. of their mean.

Fracture Toughness

Fracture toughness of the cured epoxies was measured using the compact tension (CT) method according to ASTM D5045-99 standard. The CT specimen had a nominal dimension of 41.2×39.6×5 mm. A sharp pre-crack was introduced to each CT specimen by a razor blade tapping method to minimize the effects of residual stress and plastic deformation around crack tip. A constant loading rate of 10 mm/min was adopted as recommended by ASTM D5045-99. A MTS 60484 (max. 1.8 mm) extensometer was used to measure the crack opening displacement.

EXPERIMENTAL

I: Preparation of CNT-Modified Thermoplastic Polymer

Three different concentrations of Nanocyl® NC7000 multi-walled carbon nano-tubes (90% C purity; 9.5 nm average diameter, 1.5 μm average length; available from Nanocyl®, Belgium) were dispersed in an amine-terminated polyarylethersulphone thermoplastic (a PES:PEES copolymer of molecular weight 9000-12000 as defined herein for component (A)) via a melt mixing process in a twin screw extruder. A pure sample of the same polyarylethersulphone was used as a control. High-shear screw profiles comprising conventional mixing segments associated with chaotic mixing units in order to create the optimum balance between shear and pressure forces in the barrel optimizing the dispersion levels without damaging the nano-filler integrity were used. The temperature profile and process conditions used are reported in Table 1.A.

TABLE 1.A

| | PES/MWCNT blends dispersion equipment and corresponding process conditions | | | | | | | | | | |
|---|---|---|---|---|---|---|---|---|---|---|---|
| | Temperature profile [° C.] | | | | | | | | | Screw | |
| Sample code | Zone 1 | Zone 2 | Zone 3 | Zone 4 | Zone 5 | Zone 6 | Zone 7 | Zone 8 | Zone 9 | speed [rpm] | Torque % |
| 1a | 175 | 225 | 260 | 320 | 320 | 320 | 315 | 300 | 290 | 200 | 92 |
| 1b | 175 | 225 | 260 | 320 | 320 | 320 | 315 | 300 | 290 | 200 | 88 |
| 1c | 180 | 240 | 280 | 305 | 305 | 305 | 305 | 300 | 290 | 200 | 81 |

The resulting compounds were pelletized and then casted into cylindrical moulds (diameter=5 cm; 2 mm thick) using a Collin P300 P hot parallel plates press. Five specimens per blend were then tested as described before. The corresponding conductivity results are reported in Table 1.B.

TABLE 1.B

Conductivity of MWCNT-modified PES:PEES copolymer

| Sample code | MWCNT content (w/w %) | Volume conductivity [S/m] |
|---|---|---|
| Control 1 | — | <1.0E−14 |
| 1a | 1.5 | 5.0E−03 |
| 1b | 5 | 2.5E+00 |
| 1c | 10 | 2.5E+01 |

The results demonstrate the efficiency of the dispersion method in dramatically improving the electrical conductivity of the polyarylethersulphone at relatively low MWCNTs contents. Specifically an improvement of more than 15 orders of magnitude was achieved at 10% w/w nano-filler loadings.

II: Preparation of CNT-Modified Cured Epoxy Resins

Figure 3:
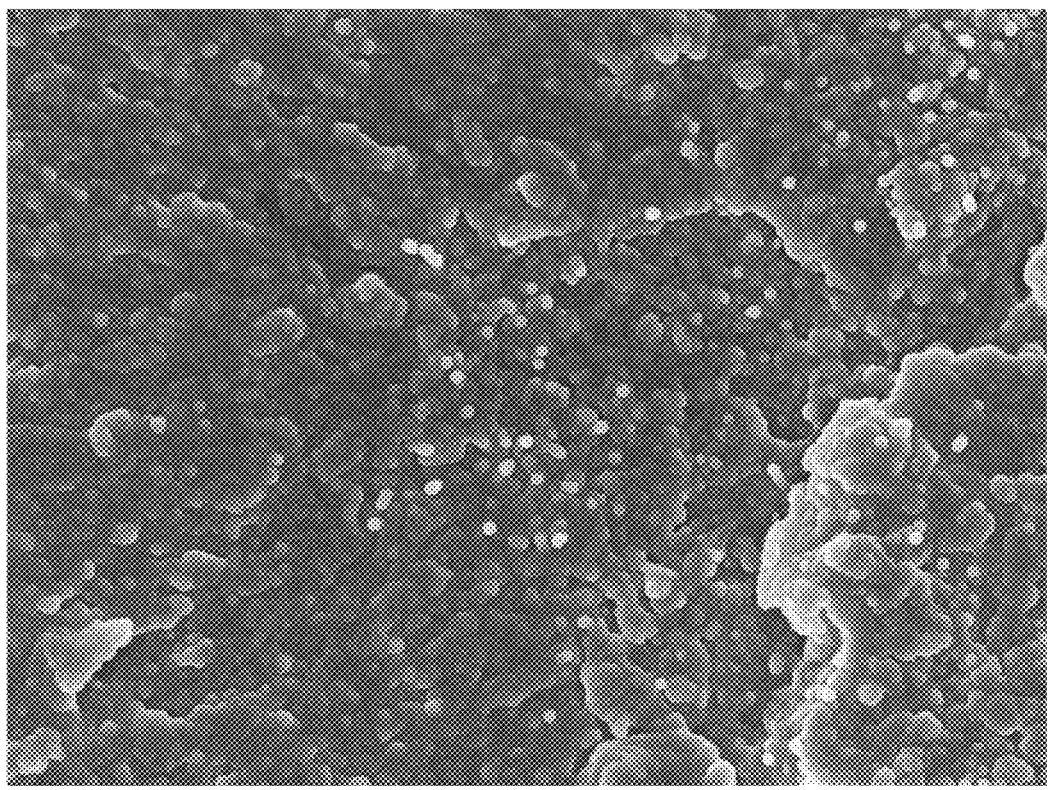
Figure 4:
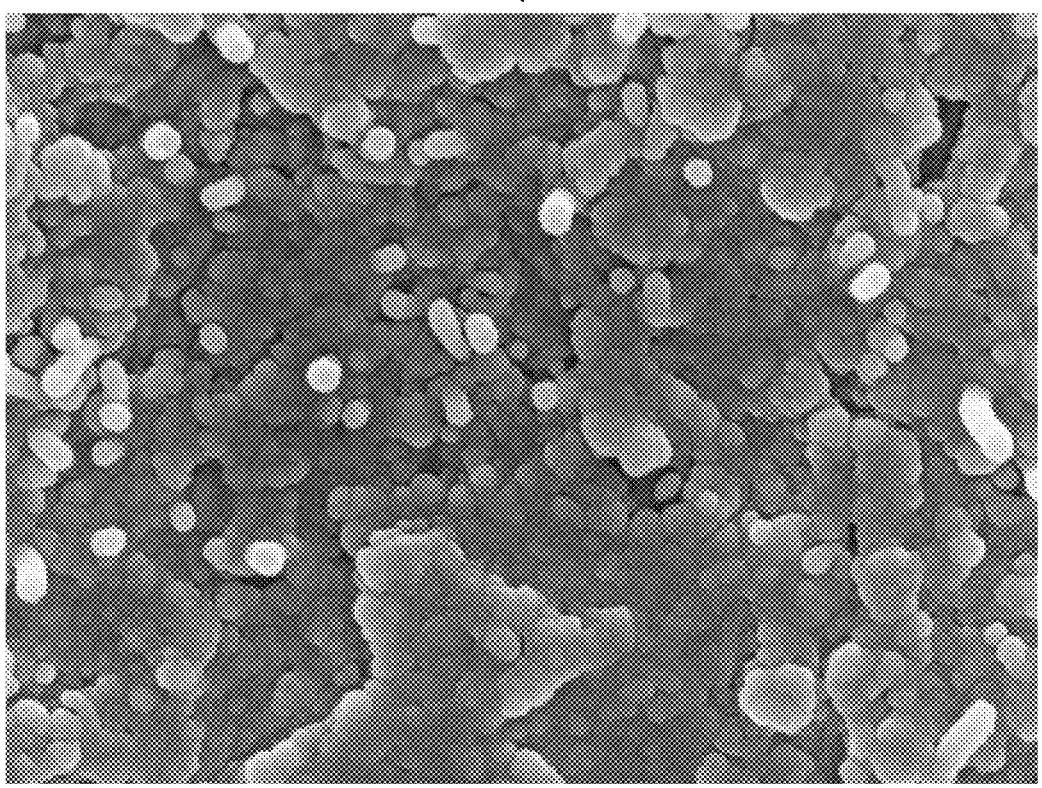
Figure 4:

Thus, the samples of Examples 1b and 1c were cryo-ground to an average particle size of less than 90 μm using an Alpine cryogenic milling system equipped with different rotating grinding media. Specifically multiple passes using stud, beater, swing beater and plate beaters were needed to achieve the target particle size distribution. The CNT-modified thermoplastic was dissolved in the epoxy components (Araldite MY0510 and Araldite PY306; from Huntsman) of the formulation prior to the addition of the curing agent (Aradur 9664; Huntsman). The samples were then degassed before curing at 180° C. for 3 hours, to produce Examples 2a and 2b. The control formulation was cured in the same manner. In two further experiments, similar formulations were prepared by dispersing the same MWCNTs at the same concentrations directly into the epoxy resins (Araldite MY0510 and Araldite PY306; Huntsman) using a high rotation speed impeller mixer prior to the thermoplastic (PES:PEES copolymer) dissolution and curing agent (Aradur 9664; Huntsman) addition. The resulting formulations were then degassed and cured in the same manner. The DC electrical conductivity and permittivity results at 10 GHz are reported in Table 2.A (in which "TP" represent "thermoplastic").

when compared to samples in which the nano-filler is dispersed directly in the epoxy formulation. Example 2b delivered the best results, improving the volume conductivity of the cured resin of over 15 orders of magnitude compared to the unmodified sample. FIGS. 3 and 4, showing FEG-SEM micrographs of cured samples of the Example 2a and 2b formulations, confirm the excellent levels of dispersion achieved at both the evaluated MWCNT concentrations.

Figure 5:
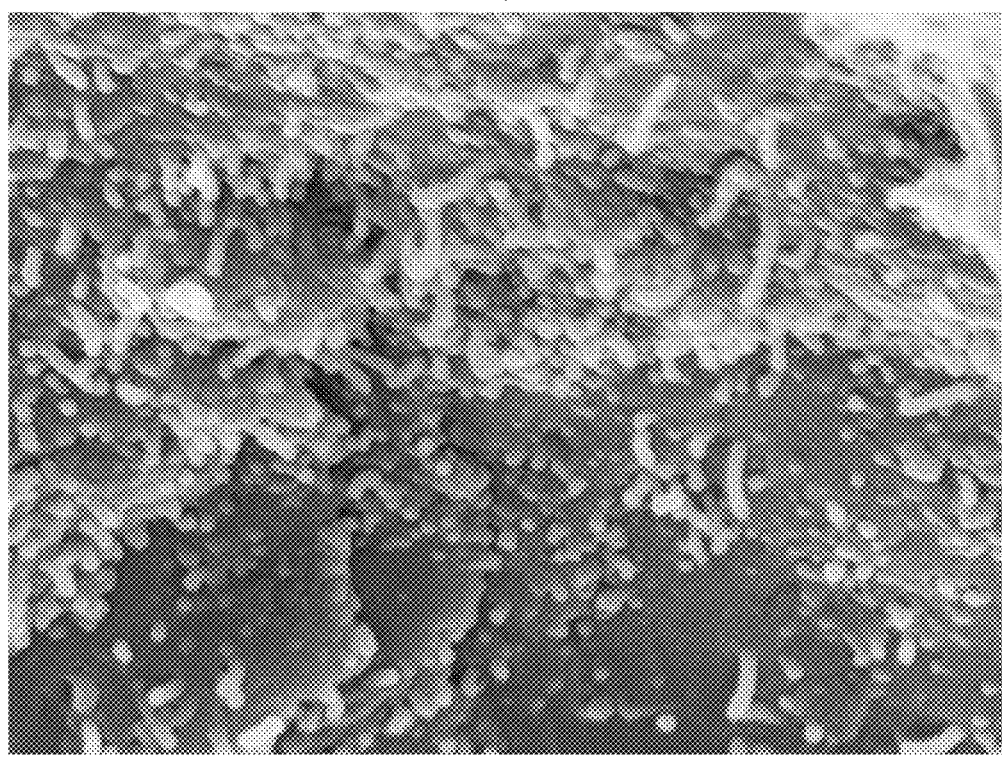
Figure 6:
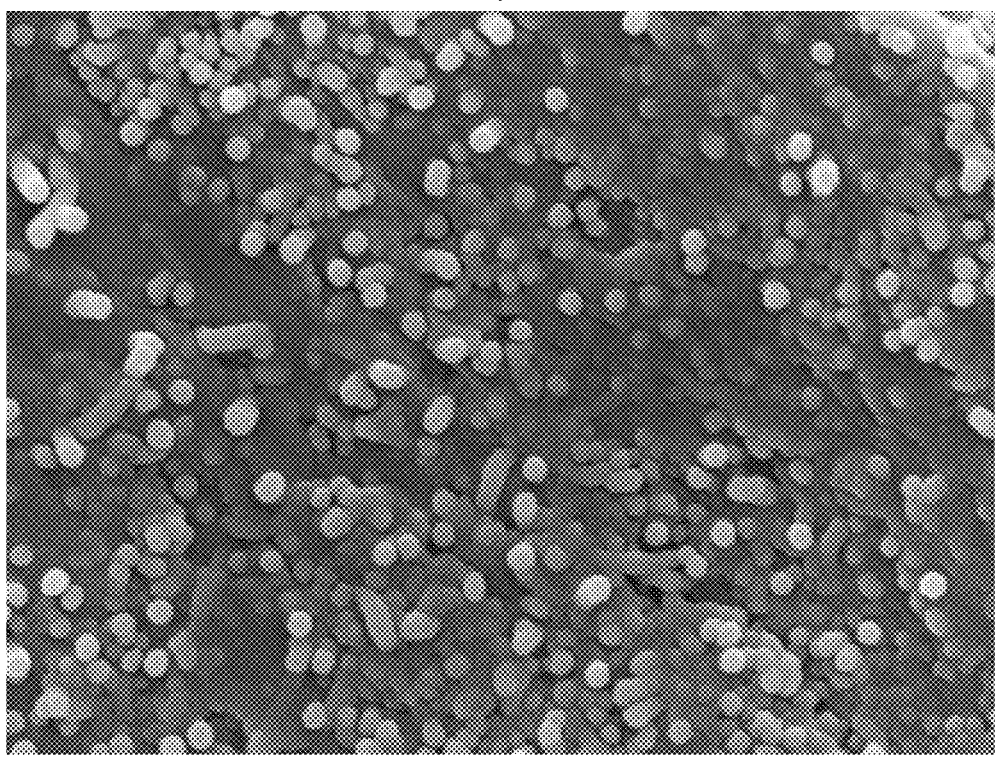
Figure 6:

Large nanotubes clusters (40-70 μm) are instead clearly visible for the cured formulations of Examples 2c and 2d containing the same nanofiller at the same concentration (FIGS. 5 and 6). The microscopic analysis further demonstrates the efficiency of polyarylethersulfone dispersion method in achieving optimal nanofiller dispersion levels in the thermoset resin composition without re-agglomeration during processing and cure.

Figure 7A:
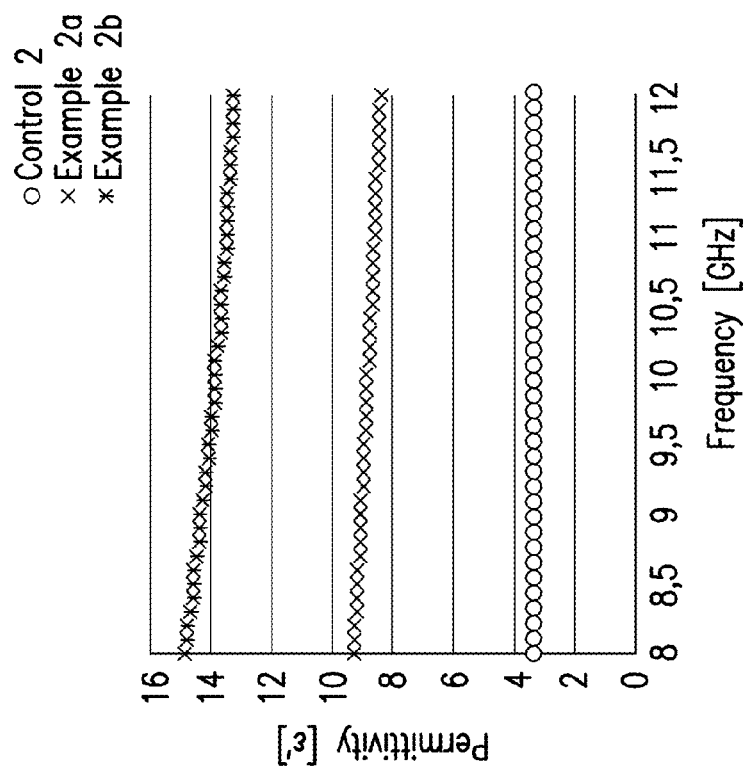
Figure 7B:
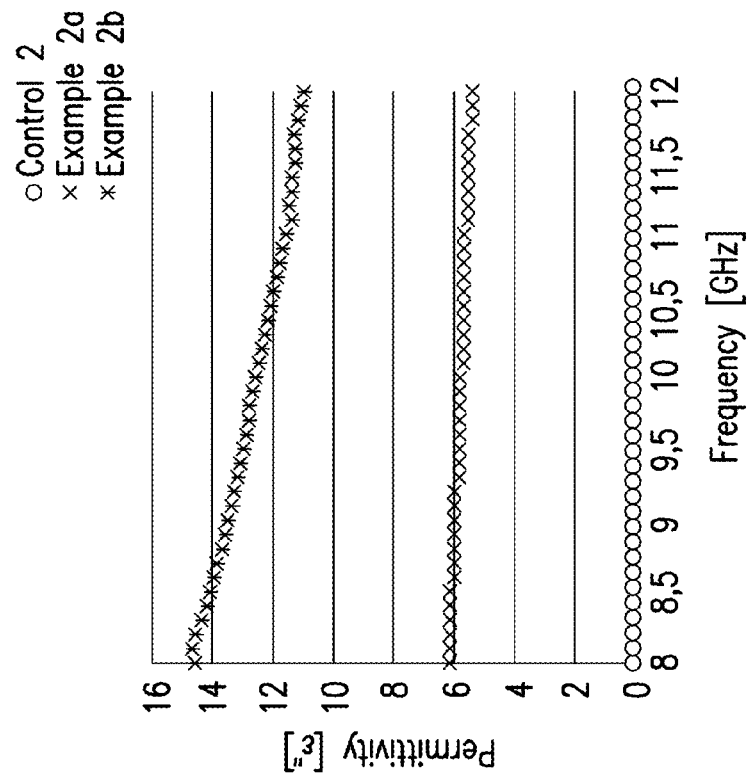

The complex permittivity was determined using the method described herein. The results are presented in FIGS. 7a (real part of the permittivity ($\epsilon'$)) and 7b (the imaginary part of the permittivity ($\epsilon''$)) as function of the frequency.

The polyarylethersulfone-assisted dispersion of nano-fillers in the resin determines a substantial improvement in both real and imaginary parts. It was observed that the imaginary part of the complex permittivity, which is directly associated to the energy dissipation, increases much more rapidly as function of the filler content in the case of polyaryethersulfone/MWCNT modified systems compared to samples in which the nano-filler is dispersed directly in the epoxy formulation. Such results can be explained on the basis of a better dispersion levels achieved by the dispersion method disclosed in the invention. The higher values of the imaginary part of the complex permittivity achieved at relatively lower CNT contents can provide designers a powerful tool to reduce the thickness and therefore the weight of single and multi-layer microwave absorbers.

The impact of MWCNT/PES:PEES dispersions on the cured resin composition thermal properties was evaluated by Dynamic Mechanical Analysis (DMA).

The compositions of Example 2b and control 2 were degassed and cured at 180° C. for 3 h. 3 coupons per formulation were extracted from defect free plaques.

The use of the polyarylether sulphone MWCNT dispersions does not substantially affect the glass transition temperature of the modified cured resin. Differences of less than 1° C. were measured between unmodified (control 2) and CNT modified (Example 2b) formulations.

The impact of MWCNT PES:PEES dispersions on the cured resin composition fracture toughness ($K_{Ic}$) was evaluated according to the Compact Tension (CT) method

TABLE 2.A

Conductivity and permittivity values at 10 GHz of CNT-modified cured epoxy resin systems

| Sample code | Araldite MY0510 (w/w %) | Araldite PY306 (w/w %) | Aradur 9664 (w/w %) | EX. 1b (w/w %) | Ex. 1c (w/w %) | PES:PEES copolymer (w/w %) | Dispersion mechanism | NC7000 MWCNT (w/w %) | Volume conductivity [S/m] | $\epsilon''$ [10 GHz] | $\epsilon''/\epsilon'$ [10 GHz] |
|---|---|---|---|---|---|---|---|---|---|---|---|
| Control 2 | 24.82 | 25.78 | 19.40 | — | — | 30 | — | — | <1.0E−14 | 0.1 | 0.03 |
| Example 2a | 24.82 | 25.78 | 19.40 | 30 | — | — | TP-assisted | 1.5 | 2.7E+00 | 5.9 | 0.66 |
| Example 2b | 24.82 | 25.78 | 19.40 | — | 30 | — | TP-assisted | 3.0 | 2.0E+01 | 12.6 | 0.90 |
| Example 2c | 24.82 | 25.78 | 19.40 | — | — | 30 | Mixing | 1.5 | 0.3E+00 | 5.0 | 0.58 |
| Example 2d | 24.82 | 25.78 | 19.40 | — | — | 30 | Mixing | 3.0 | 1.0E+01 | 11.8 | 0.85 |

The results demonstrate that the dispersion of the nano-fillers into the epoxy resin is much more effective when the nano-fillers are pre-treated with the thermoplastic polymer, described herein. The use of the polyarylether sulphone MWCNT dispersions as in Example 2b does not substantially affect the fracture toughness values of the modified system. Differences of less than 5% were observed between the performance of control 2 and of the MWCNT modified formulation of Example 2b.

III: Preparation of Fibre Reinforced Composite Samples

The resin system used in Example 2b was filmed onto silicone release paper. The resulting resin film was impregnated onto unidirectional intermediate modulus carbon fibres, using a pilot scale UD prepregger, which produced a prepreg with a fiber areal weight of 196 g/m$^2$ at 38% of resin content.

Test panels (referred to as Example 3 herein) were manufactured in accordance to EN2565 curing in autoclave 8 plies of prepreg (quasi-isotropic layup) for 3 hours at 180° C.

For comparison purposes, the resin system of Control 2 was used to prepare otherwise identical unidirectional tapes and test panels (Control 3). The DC electrical volume conductivity of the resulting composite samples was then measured according to a 4-wire volt-amperometric method. The results are shown in Table 3.A.

TABLE 3.A

| Conductivity values of the composites | | |
|---|---|---|
| Sample code | MWCNT content (w/w %) | Volume conductivity [S/m] |
| Control 3 | — | 3.9E−01 |
| Example 3 | 3.0 | 5.0E+00 |

A variety of mechanical tests were carried out on the batches made according to Example 3 and Control 3 and the results are shown below in Table 3.B.

TABLE 3.B

| Mechanical performance of CNT-modified carbon fiber reinforced composites | | |
|---|---|---|
| Mechanical property | Control 3 | Example 3 |
| CSAI [MPa] EN6038 | 226 | 258 |
| Gic [J/m$^2$] EN6033 | 334 | 310 |
| Giic [J/m$^2$] EN6034 | 751 | 787 |
| OHC [MPa] EN6036 | 377 | 350 |
| OHC H/W EN6036/EN2823 | 290 | 336 |
| 0 CM [GPa] EN2850 | 147 | 148 |
| 0 CS [MPa] EN2850 | 1516 | 1657 |
| 0 TM [GPa] EN2561B | 165 | 166 |
| 0 TS [MPa] EN2561B | 2627 | 2763 |
| ILSS [MPa] EN2563 | 126 | 127 |
| Tg EN6032 | 172 | 171 |

All tests and physical properties listed have been determined at atmospheric pressure and room temperature (i.e. 20° C.), unless otherwise states herein, or unless otherwise stated in the referenced tests methods and procedures. It can be seen that the dispersion of up to the 3% of NC 7000 MWCNT using the approach disclosed in the application does not have a noticeable impact on the mechanical properties of the structural composite material.

IV: Preparation of Single Layer EM Absorbing Panel

Four different concentrations of multi-walled carbon nano-tubes (98% C purity, 15 nm average diameter, available from Future Carbon®, Germany) were dispersed in an amine-terminated polyarylethersulphone thermoplastic (a PES:PEES copolymer of molecular weight 9000-12000 as defined herein for component (A) via the melt mixing process according to the procedure described in example I.

TABLE 4.A

| Polyarylethersulfone/MWCNT dispersions | |
|---|---|
| Sample code | MWCNT content (w/w %) |
| 4a | 1.5 |
| 4b | 3 |
| 4c | 4 |
| 4d | 6 |

The resulting compounds were pelletized and cryo-ground to an average particle size of less than 90 μm using an Alpine cryogenic milling system equipped with different rotating grinding media. The CNT-modified thermoplastic was dissolved in the epoxy components (Araldite MY0510 and Araldite PY306; from Huntsman) of the formulations reported in Table 4B prior to the addition of the curing agent (Aradur 9664; Huntsman).

TABLE 4.B

| Examples of CNT-modified cured epoxy resin systems | | | | | | | | | |
|---|---|---|---|---|---|---|---|---|---|
| Sample code | Araldite MY0510 (w/w %) | Araldite PY306 (w/w %) | Aradur 9664 (w/w %) | EX. 4a (w/w %) | Ex. 4b (w/w %) | EX. 4c (w/w %) | Ex. 4d (w/w %) | PES:PEES copolymer (w/w %) | MWCNT (w/w %) |
| Control 2 | 24.82 | 25.78 | 19.40 | — | — | — | — | 30 | — |
| Example 4e | 24.82 | 25.78 | 19.40 | 30 | — | — | — | — | 0.45 |
| Example 4f | 24.82 | 25.78 | 19.40 | — | 30 | — | — | — | 0.90 |
| Example 4g | 24.82 | 25.78 | 19.40 | — | — | 30 | — | — | 1.2 |
| Example 4h | 24.82 | 25.78 | 19.40 | — | — | — | 30 | — | 1.8 |

The resulting compositions were degassed, casted in WR90 rectangular flanges and cured at 180° C. for 3 hours.

Figure 8B:
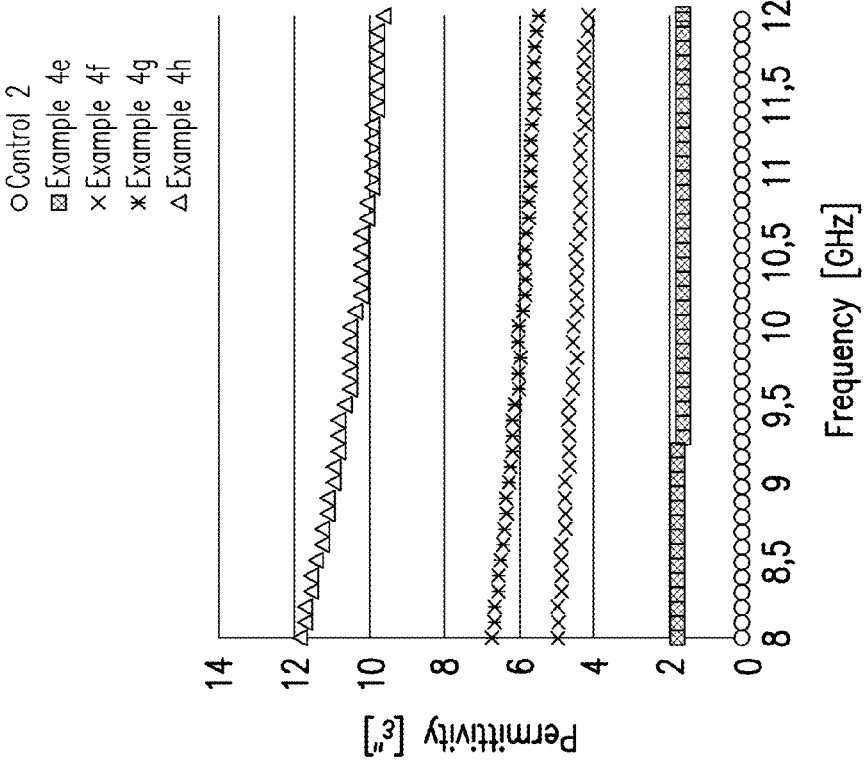
Figure 8A:
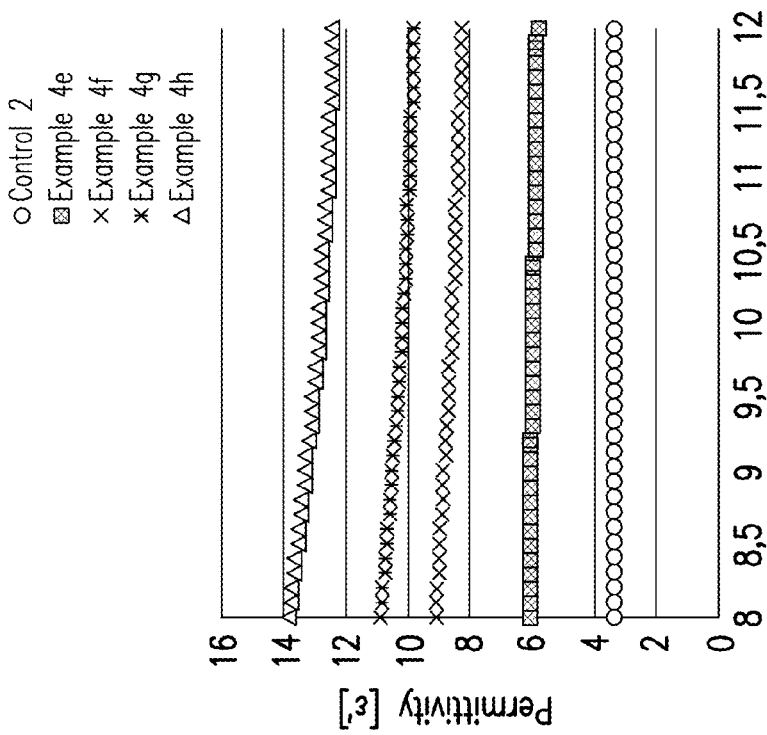

The real ($\in'$) and imaginary ($\in''$) parts of the permittivity as a function of the frequency for the formulations described in Examples 4e, 4f, 4 g and 4 h and control 2 are reported respectively in FIGS. 8a and 8b (the imaginary part of the permittivity). The experimental results demonstrate that a controlled increment in permittivity can be achieved increasing the multi-walled carbon nano-tubes content in the 8-12 GHz frequency range. The polymer dispersion method disclosed herein provides the formulator a powerful tool to finely modulate the nano-filler concentration and subsequently the complex permittivity of the modified resin system.

The resin system reported in Example 4c was first filmed onto silicone release paper and then used to impregnate an Astroquartz® III 8-Harness Satin fabric to produce a prepreg with a fibre areal weight of 285 g/m$^2$ at 38% w/w resin content. 12 plies were laminated and cured in autoclave at 180° C. for 3 h under the pressure of 6 atm to produce a composite panel with a nominal thickness of 3.0 mm. A second fibre reinforced quasi-isotropic $[QI]_{2s}$ composite panel was manufactured curing in the same conditions 8 plies of the unidirectional prepreg described in Example 3 (Control 3), which was produced by impregnating intermediate modulus fibers with Control 2 resin. A single-layer radar absorbing panel was produced in accordance with the schematization in FIG. 1 co-bonding the two panels using a FM® 300-2M 0.030 psf adhesive film (available from Cytec Engineered Materials) in autoclave at 121° C. for 90 minutes.

Figure 9:
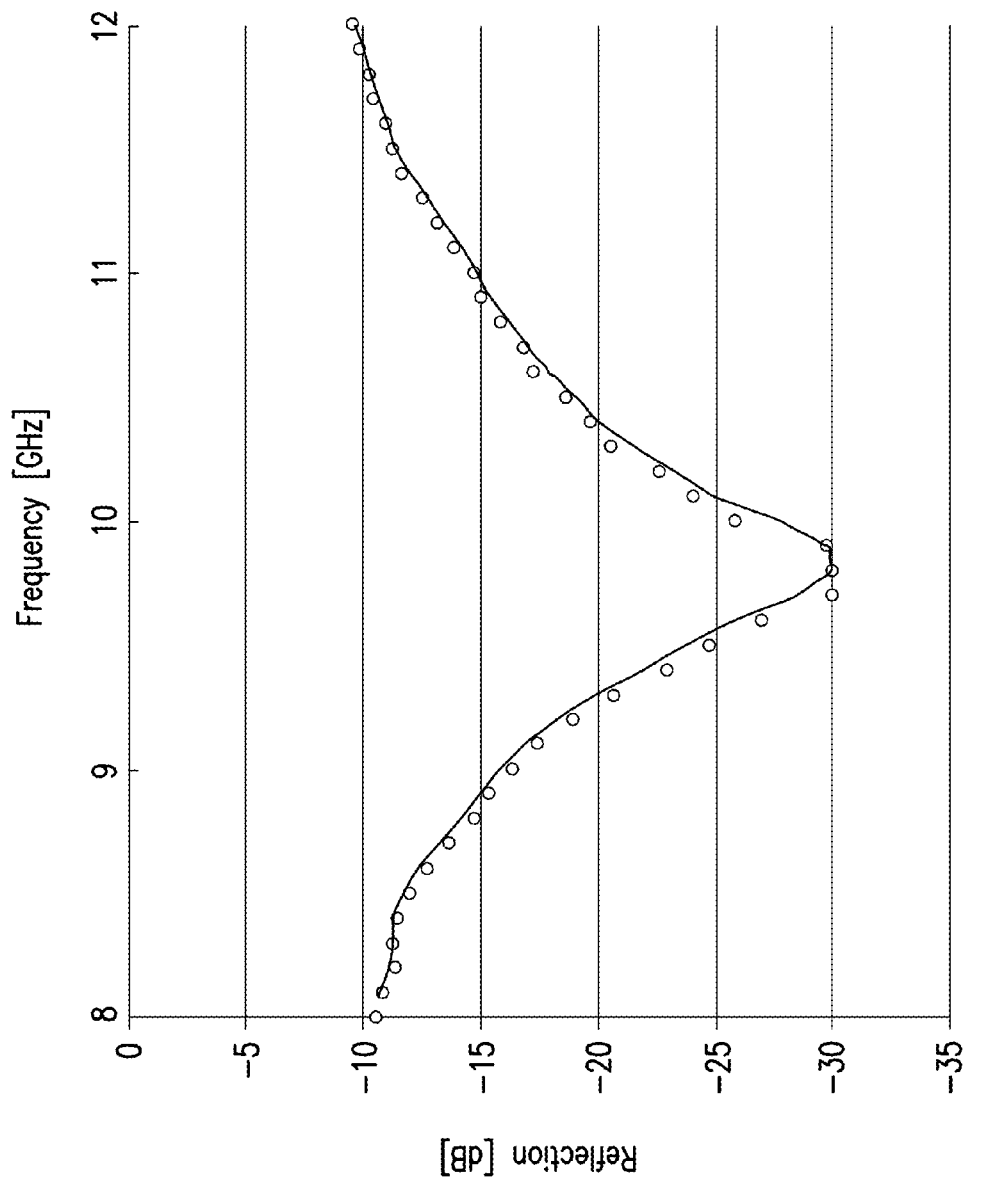

FIG. 9 reports the reflection loss of the composite panel measured in free space conditions as described herein. The composite panel showed an absorbing efficiency greater than 10 dB over the entire 8-12 GHz band, with a maximum of about 30 dB at 10 GHz. This result is generally considered satisfactory for the use of the present invention.

For comparison purposes, the resin system of Control 2 was used to prepare otherwise identical pre-impregnated Astroquartz fabric and test panel (Control 5 panel). Control 5 panel was then co-bonded with an identical quasi-isotropic carbon fiber reinforced panel using a FM® 300-2M 0.030 psf adhesive film as described before. The measured absorbing efficiency was less than 2 dB in the measured frequency range (8-12 GHz). The performance of the structure of the described invention cannot be achieved with a panel having the same thickness and structure (Control 6).

The CNT polymer assisted dispersion of CNTs in the resin matrix provides a flexible tool to accurately control the permittivity values of the modified resin compositions and pre-impregnated materials allowing the design and manufacturing of lightweight and structural EM absorbing panels.

V: Comparative Example 5

Dispersion of Dry CNTs in Epoxy Resin Precursors

The potential for enhancing the electrical conductivity of an epoxy resin system was investigated using commercially available carbon nanotube products. The nanotubes were mixed at various concentrations with the epoxy component of the resin system and then dispersed using either sonication or high-shear 3 roll-milling.

Comparative Examples 5a-5b

For comparison purposes, the control 2 formulation was modified using different contents of the polyethersulfone/ CNT pre-dispersion of Example 1c depending on the target nanofiller concentration.

Comparative Examples 5c-5d

Nanocyl® NC3100 (MWCNT; external diameter 9.5 nm; 95+% purity) was dispersed in the epoxy resins of the reported formulations using a Hielscher UP200S sonicator (operating at 24 kHZ; room temperature; 30 minutes).

Comparative Example 5e-5f

NanoAmor® MWCNTs (internal diameter 5-10 nm; external diameter 50-100 nm; 95% purity; available from Nanostructured & Amorphous Materials Inc, US) were dispersed in the epoxy resins of the reported formulations using a Cole Parmer 750W sonicator (operating at 20 kHZ; amplitude=37%; pulse=3 seconds ON, 1 second OFF; room temperature; 30 minutes).

Comparative Example 5g-5h

NanoAmor® MWCNTs were dispersed in the epoxy resins of the reported formulations using an Exakt triple roll mill in two passes. On the first pass the initial gap was 15 μm and the second gap was 5 μm. On the second pass the initial gap was 5 μm and a force applied to maintain the second gap at less than 1 μm.

For each of Comparative Examples 5a to 5h, the curing agent was then added to the epoxy pre-dispersion at 100° C. and the resulting system degassed and cured at 180° C. for 3 hours. The cured samples' conductivity was then measured according to the test described herein. The conductivity of control 2 sample cured in the same manner was less than $1\times10^{-14}$ S/m.

TABLE 5.A

Conductivity values of cured resin samples modified with different commercial MWCNT types and contents and according to different dispersion methods

| Sample code | Araldite MY0510 (w/w %) | Araldite PY306 (w/w %) | Aradur 9664 (w/w %) | Ex. 1c (w/w %) | NC7000 MWCNT (w/w %) | NC3100 MWCNT (w/w) % | Nanoamor MWCNT (w/w %) | Dispersion mechanism | Volume conductivity [S/m] |
|---|---|---|---|---|---|---|---|---|---|
| Control 2 | 35.4 | 36.8 | 27.7 | — | — | — | — | — | <1.0E−14 |
| 5a | 34.6 | 35.9 | 27.0 | 2.5 | 0.5 | — | — | TP-assisted | 5.0E−02 |
| 5b | 33.7 | 35.0 | 26.3 | 5 | 1.0 | — | — | TP-assisted | 1.4E−01 |
| 5c | 35.3 | 36.6 | 27.6 | — | — | 0.5 | — | Sonication | 6.0E−03 |
| 5d | 35.1 | 36.5 | 27.4 | — | — | 1.0 | — | Sonication | 1.5E−02 |

TABLE 5.A-continued

Conductivity values of cured resin samples modified with different commercial MWCNT types and contents and according to different dispersion methods

| Sample code | Araldite MY0510 (w/w %) | Araldite PY306 (w/w %) | Aradur 9664 (w/w %) | Ex. 1c (w/w %) | NC7000 MWCNT (w/w %) | NC3100 MWCNT (w/w) % | Nanoamor MWCNT (w/w %) | Dispersion mechanism | Volume conductivity [S/m] |
|---|---|---|---|---|---|---|---|---|---|
| 5e | 35.3 | 36.6 | 27.6 | — | — | — | 0.5 | Sonication | 1.5E−09 |
| 5e | 35.1 | 36.5 | 27.4 | — | — | — | 1.0 | Sonication | 1.5E−03 |
| 5g | 35.3 | 36.6 | 27.6 | — | — | — | 0.5 | 3 Roll Milling | 3.0E−010 |
| 5h | 35.1 | 36.5 | 27.4 | — | — | — | 1.0 | 3 Roll Milling | 3.3E−04 |

Samples modified by high purity Nanocyl® NC3100 exhibited better conductivity than the NanoAmor® MWCNT samples. As the same nominal carbon purity (>95%) dispersion method and conditions were used the difference in performance may be attributed to the different nanofiller aspect ratio and synthetic process. The sonicated NanoAmor® samples exhibited slightly better conductivity than the milled NanoAmor® samples, which may be a result of an inferior dispersion level or damage to the MWCNTs during the high-shear milling process. In general, however, a conductivity increase of between 11 and 12 orders of magnitude was observed for MWCNT concentrations above 0.2% w/w. The best conductivity achieved was about $1.5 \times 10^{-2}$ S/m, which was observed for high purity (>95%) Nanocyl® 3100 MWCNTs at a concentration of 1% w/w dispersed in the epoxy component by sonication.

The conductivities reported in Table 5.A above for the examples according to the invention demonstrate the effectiveness of the polyarylethersulphone thermoplastic polymer in dispersing the CNTs into the epoxy resin matrix, relative to Comparative Example 5b. In fact much higher conductivity values, up to $1.4 \times 10^{-1}$ S/m at 1% w/w CNT loading, was achieved with lower purity nanofillers (90%).

VI: Comparative Example 6

Pre-Dispersions of CNTs in Epoxy Resin Precursors

Several pre-dispersions of carbon nanotubes in epoxy resin precursors are commercially available, and a series of experiments were conducted using the following products:

(A): EpoCyl® NC E128-02 (NC7000 MWCNTs (90% C purity) masterbatch in bisphenol-A epoxy; Nanocyl®);

(B): EpoCyl® NC E1MY-02 (NC7000 MWCNTs (90% C purity) masterbatch in TGMDA (tetraglycidyl methylenedianiline) epoxy; Nanocyl®);

(C): Graphistrength CS1-25 pellets (25% w/w MWCNT (90% C purity) masterbatch in bisphenol-A epoxy; Arkema®).

These dispersions were used to replace all or part of the epoxy component in the Control 2 resin system. For comparative example 6a, EpoCyl® NC E128-02 was used as sole epoxy component in the formulation to evaluate the full potential of the product. For comparative example 6b, the pre-dispersion was unprocessable in isolation at any of the temperatures and vacuum conditions attempted and so was used in combination (50:50 w/w) with the bisphenol-A epoxy dispersion of comparative example 6a. The curing agent was added for all the epoxy blends at 100° C. and the mixtures degassed under vacuum before curing at 180° C. for 3 hours. The samples were then tested for conductivity according to the protocol described herein.

TABLE 6.A

Conductivity values of cured resin systems modified using different commercial epoxy/MWCNT pre-dispersions

| Sample code | Araldite MY0510 (w/w %) | Araldite PY306 (w/w %) | Aradur 9664 (w/w %) | Epocyl® NC E128-02 (w/w %) | Epocyl® NC E1MY-02 (w/w %) | Graphistrength® CS1-25 (w/w %) | Arkema MWCNT (w/w %) | Volume conductivity [S/m] |
|---|---|---|---|---|---|---|---|---|
| 6a | — | — | — | | | — | — | 6.3E−06 |
| 6b | — | — | | | | | — | 3.9E−11 |
| 6c.1 | 35.4 | 32.8 | 27.7 | — | — | 4 | 1.0 | 3.2E−05 |
| 6c.2 | 35.4 | 30.8 | 27.7 | — | — | 6 | 1.5 | 2.2E−04 |
| 6c.3 | 35.4 | 24.8 | 27.7 | — | — | 12 | 3.0 | 3.0E−01 |

For comparative examples 6a and 6b, the best conductivity values obtained were $6 \times 10^{-6}$ S/m and $3 \times 10^{-11}$ S/m, respectively, and hence significantly inferior to the compositions of the present invention.

For comparative examples 6c.1, 6c.2, 6c.3, Arkema Graphistrength® CS1-25 epoxy pre-dispersion was used at varying concentrations to replace part of the di-functional epoxy component in control 2 resin system, depending on the target MWCNT content. A good conductivity improvement were measured with a maximum of 0.3 S/m being observed for a sample having a final concentration of 3% w/w CNTs in the epoxy resin.

Figure 10:
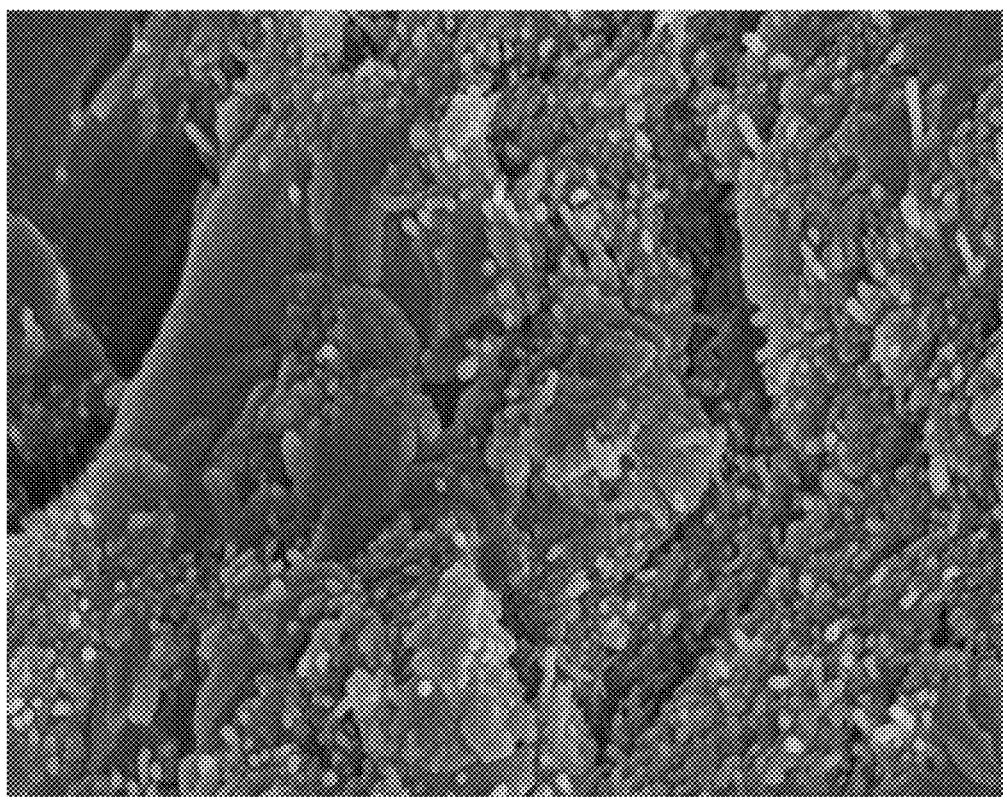

FIG. 10 shows a FEG-SEM micrograph of a cured sample of the Example 6c.2 formulation. Although a discontinuous percolation network is observable, large MWCNT agglomerates in the 20-40 μm range are clearly visible demonstrating the inefficiency of the CS1-25 epoxy/MWCNT masterbatch in adequately dispersing the nano-filler in the epoxy resin composition.

The results show that the compositions of the present invention are functional to the achievement of conductivity values which are much better than those of the prior art, without the need to resort to relatively expensive commercial master-batches. The disclosed technology offers particular advantages to the formulators due to high concentration of MWCNT. It also offers a process advantage, with the possibility to efficiently control the MWCNT introduction in the resin formulation using conventional mixing equipment and during standard prepreg manufacturing processes.

VII: Comparative Example 7

Pre-Dispersions of CNTs in a Conventional Thermoplastic Polymer to Deliver the CNTs into the Epoxy Resin Graphistrength® C M13-30 (Arkema, France) is a commercially available masterbatch with high loadings (approx 30% w/w) of MWCNTs in a thermoplastic ter-polymer (styrene/butadiene/methylmethacrylate) designed for electrostatic discharge (ESD) protection applications. A series of experiments was conducted using different concentrations of the C M13-30 masterbatch dissolved in the epoxy components of the resin systems reported in Table while being sonicated (Cole Parmer sonicator operated as above except for an operating temperature of 130° C.). The concentration of MWCNTs relative to the total resin system composition was in the range of 0.5 to 3% w/w.

The curing agent was then added and the resulting system degassed and cured at 180° C. for 3 hours. The samples were then tested for conductivity according to the protocol described herein.

TABLE 7.A

Conductivity values of cures control 2 resin systems modified with different contents of Graphistrength ® CM13 30.

| Example | Araldite MY0510 (w/w %) | Araldite PY306 (w/w %) | Aradur 9664 (w/w %) | Graphistrength ® CM 13-30 (w/w %) | MWCNT content (w/w %) | Volume conductivity [S/m] |
|---|---|---|---|---|---|---|
| 7a | 34.9 | 36.2 | 27.2 | 1.7 | 0.5 | 5.5E−12 |
| 7b | 34.4 | 35.7 | 26.9 | 3.0 | 0.9 | 5.6E−12 |
| 7c | 34.0 | 35.3 | 26.6 | 4.0 | 1.2 | 5.1E−06 |
| 7d | 33.7 | 35.0 | 26.3 | 5.0 | 1.5 | 8.2E−04 |
| 7e | 31.9 | 33.1 | 24.9 | 10.0 | 3 | 2.4E−01 |

Figure 11:
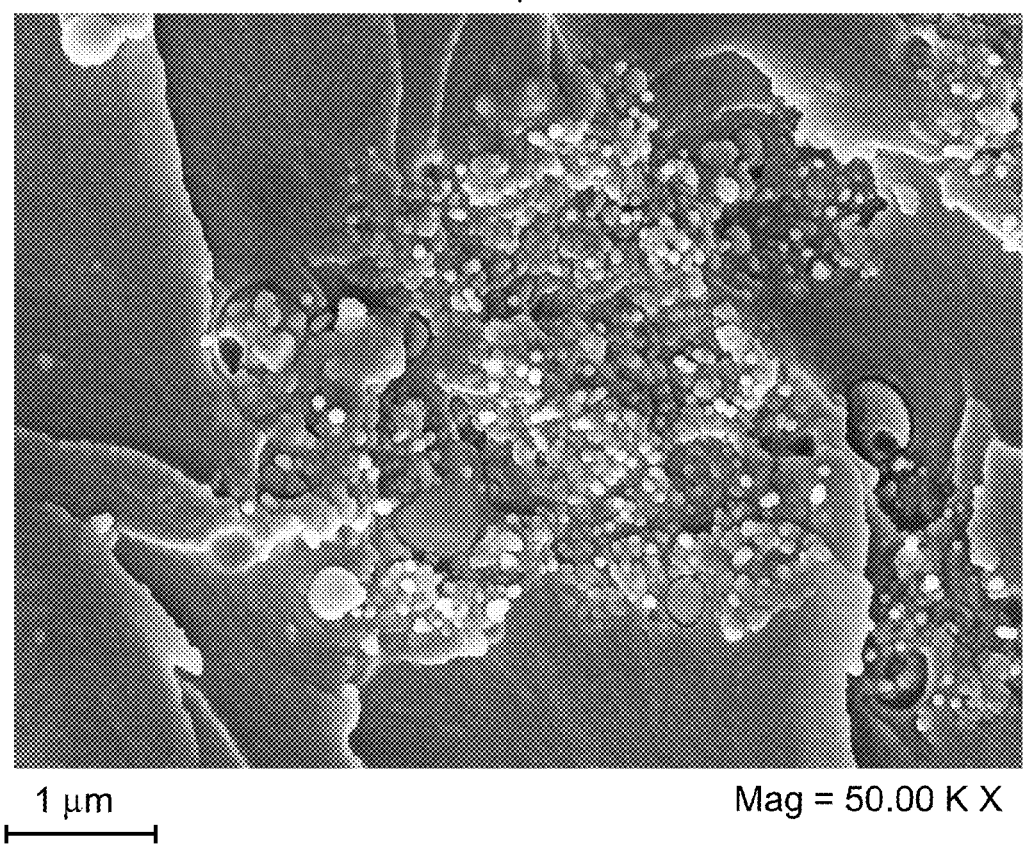

The percolation threshold was achieved only at MWCNT concentrations greater than about 1.2% w/w. The highest conductivity achieved was only about $2\times10^{-1}$ S/m at 3% w/w CNT loadings. The relatively small increase in conductivity may be a result of the limited or no interaction between the nanofiller and the methacrylate polymer and to the insufficient dispersion levels achievable due to the sub-optimal compatibility of the masterbatch in the resin formulation. FIG. 11 shows a FEG-SEM micrograph of a cured sample of Example 8a formulation. The cured system presents a particulate morphology with micrometric thermoplastic domains distributed in the resin matrix. MWCNT agglomerates with a size in the 3-5 μm range are clearly visible as a result of the limited dispersion and poor distribution of the nanofiller in the resin matrix.

The conductivity values reported in Table 2 for the examples according to the invention demonstrate the effectiveness of the polyarylethersulphone thermoplastic polymer in dispersing the CNTs into the epoxy resin matrix, relative to Comparative Example 7.

VIII: Comparative Example 8

Dispersing CNTs into Thermoplastic Polymers for Delivery of the CNTs into the Epoxy Resin A series of experiments was conducted to compare the polyarylethersulphone thermoplastic polymer used in examples 1 to 5 with commercially available thermoplastic toughening agents for the ability to increase the conductivity of an epoxy resin system. The thermoplastics (TP) used were polyimide (Matrimid® 9725; Huntsman) and polyetherimide (Ultem® 1000; GE Plastics). A 10% w/w CNTs concentration in the thermoplastic was used in all the experiments. Nanocyl NC7000 industrial MWCNTs (90% C purity) were dispersed in the thermoplastic polymers using a Prism extruder equipped with 24 mm co-rotating twin screw with a LD ratio of 40 to 1. The temperature profile reported in Table 8.B was developed to ensure optimum shear/pressure values along the barrel and optimal nanofiller dispersion levels in the thermoplastic matrix.

TABLE 8.A

TP/MWCNT dispersions

| Blend code code | TP type | MWCNT content (w/w %) |
|---|---|---|
| 8a | Ultem ® 1000 | 10 |
| 8b | Matrimid ® 9725 | 10 |

TABLE 8.B

TP/MWCNT blends dispersion conditions

| Blend code | Zone 1 | Zone 2 | Zone 3 | Zone 4 | Zone 5 | Zone 6 | Zone 7 | Zone 8 | Zone 9 | Screw speed [rpm] | Torque % |
|---|---|---|---|---|---|---|---|---|---|---|---|
| 8a | 180 | 300 | 360 | 380 | 380 | 385 | 385 | 385 | 380 | 200 | 82 |
| 8b | 200 | 320 | 380 | 400 | 400 | 405 | 405 | 405 | 400 | 150 | 90 |

The CNT-modified thermoplastic was combined with the epoxy components of the resin system as described for Examples 2 above prior to the addition of the curing agent. The samples were then degassed before curing at 180° C. for 3 hours. Conductivity was measured according to the method described herein. The results for each CNT modified cured epoxy resin system are shown in Table 8.0 below.

TABLE 8.C

Conductivity values of the CNT-modified cured epoxy resin systems.

| Example | Araldite MY0510 (w/w %) | Araldite PY306 (w/w %) | Aradur 9664 (w/w %) | Ex. 1c (w/w %) | Ex. 9a (w/w %) | Ex. 9b (w/w %) | MWCNT content (w/w %) | Volume conductivity [S/m] |
|---|---|---|---|---|---|---|---|---|
| 2b | 24.82 | 25.78 | 19.40 | 30 | — | — | 3 | 2.0E+01 |
| 8c | 24.82 | 25.78 | 19.40 | — | 30 | — | 3 | 1.0E−06 |
| 8d | 24.82 | 25.78 | 19.40 | — | — | 30 | 3 | 6.6E−06 |

The results demonstrate the increased conductivity of the samples in which polyarylethersulphone was used to disperse the CNTs in the epoxy resin, relative to the commercially available polyimide and polyetherimide thermoplastic toughening agents.

IX: Comparative Example 9

Dispersing CNTs into Thermoplastic Polymers for Delivery of the CNTs into the Epoxy Resin A series of experiments was conducted to compare the amine-terminated polyarylethersulphone thermoplastic polymer used in examples 1 to 5 with 100% non-reactive chlorine ended polyethersulfone toughening agents for the ability to increase the conductivity of an epoxy resin system. The thermoplastic was synthetized according to the procedure described in WO9943731A2 utilising a moderate excess of activated aromatic halogenide to produce a polymer having 100% terminal halogenate groups.

Two different concentrations of Nanocyl® NC7000 multi-walled carbon nano-tubes (90% C purity; 9.5 nm average diameter, 1.5 μm average length; available from Nanocyl®, Belgium) were dispersed in the chlorine-terminated polyethersulphone thermoplastic (a PES polymer of molecular weight 15-18K) via a melt mixing process in as described in Example 1. The temperature profile and process conditions used are reported in Table 9.A.

TABLE 9.A

PES/MWCNT blends dispersion equipment and corresponding process conditions

| Sample code | Temperature profile [° C.] | | | | | | | | | Screw speed [rpm] | Torque % |
|---|---|---|---|---|---|---|---|---|---|---|---|
| | Zone 1 | Zone 2 | Zone 3 | Zone 4 | Zone 5 | Zone 6 | Zone 7 | Zone 8 | Zone 9 | | |
| 9a | 175 | 225 | 260 | 320 | 320 | 320 | 315 | 300 | 290 | 200 | 94 |
| 9b | 175 | 225 | 260 | 320 | 320 | 320 | 315 | 300 | 290 | 200 | 90 |

TABLE 9.B

PES/MWCNT dispersions

| Blend code code | TP type | MWCNT content (w/w %) |
|---|---|---|
| 9a | 100% Cl ended PES | 5 |
| 9b | 100% Cl ended PES | 10 |

The CNT-modified thermoplastic was combined with the epoxy components of the resin system as described for Examples 2 above prior to the addition of the curing agent. The samples were then degassed before curing at 180° C. for 3 hours. Conductivity was measured according to the method described herein. The results for each CNT modified cured epoxy resin system are shown in Table 9.0 below.

TABLE 9.C

Conductivity values of the CNT-modified cured epoxy resin systems.

| Example | Araldite MY0510 (w/w %) | Araldite PY306 (w/w %) | Aradur 9664 (w/w %) | Ex. 1b (w/w %) | Ex 1c (w/w %) | Ex. 9a (w/w %) | Ex. 9b (w/w %) | MWCNT content (w/w %) | Volume conductivity [S/m] |
|---|---|---|---|---|---|---|---|---|---|
| 2a | 24.82 | 25.78 | 19.40 | 30 | — | — | — | 1.5 | 2.7E+00 |
| 2b | 24.82 | 25.78 | 19.40 | — | 30 | — | — | 3 | 2.0E+01 |
| 9c | 24.82 | 25.78 | 19.40 | — | — | 30 | — | 1.5 | 1.0E−02 |
| 9d | 24.82 | 25.78 | 19.40 | — | — | — | 30 | 3 | 1.0E−01 |

The results demonstrate the increased conductivity of the samples in which the reactive polyarylethersulphone described in the patent claims was used to disperse the CNTs in the epoxy resin, relative to a non-reactive chlorine ended polyethersulfone.

X: Preparation of Polyethersulfone/CNT Dispersion Via In-Situ Polymerization Route 1 g of single walled carbon nanotubes (Thomas Swan; UK) were added into a vessel containing 100 ml of sulfolane and dispersed using a sonicator. The sonicator microtip was immersed approximately 1 cm in the suspension and set to 37% amplitude. The probe was pulsed on for 3 seconds and off for 1 second. This was carried out for 4 hours; therefore the total pulse on time was 3 hours. This material was used as half of the 200 ml of solvent for the synthesis of the PES:PEES copolymer using the synthetic route described in example 1.1 of WO9943731A2, herein incorporated. 65.000 g of dichlorodiphenylsulfone, 21.741 g of bisphenol-S, 14.348 g of hydroquinone and 2.002 g of meta aminophenol were added to a 500 ml reaction vessel. The 100 ml of CNT/sulfolane pre-dispersion was at this stage along with a further 100 ml of sulfolane. The monomers were stirred overnight under nitrogen at room temperature. 32.203 g of potassium carbonate was added to the mixture along with a further 50 ml of sulfolane. The vessel was heated to 180° C. and held for 30 minutes, then ramped to 210° C. and held for 1 hour and finally ramped to 230° C. and held for 4 hours. The resulting black coloured viscous liquid polymer was precipitated into water and washed with several batches of hot water. The washing stages finally yielded a grey coloured powder.

XI: Preparation of Polyethersulfone/CNT Fibers Via the Combined In-Situ Polymerization/Melt Extrusion Route The resulting polyarylethersulfone/CNT dispersion was fed in a Prism extruder equipped with 24 mm co-rotating twin screw with a LD ratio of 40 to 1. The same temperature profile reported in Table 1 Example 1a/b was used to ensure optimum shear/pressure values along the barrel and optimal nanofiller dispersion levels in the thermoplastic matrix. Fibres of approximately 100-200 micron were produced.

The invention claimed is:

1. A process for the production of a curable composition, comprising:
    forming a first composition comprising one or more conductive nano-filler(s) coated or wrapped with one or more macro-molecules of one or more polyarylethersulphone thermoplastic polymer(s) (A); and
    mixing or dispersing the first composition with or into a second composition comprising one or more uncured thermoset resin precursor(s) (P), and optionally one or more curing agent(s) therefor,
    wherein the first composition does not comprise an uncured thermoset resin precursor.

2. A process according to claim 1 wherein said first composition comprises said conductive nano-filler (CNF) in an amount such that the mass fraction w(CNF) is from about 1% to about 20%, wherein w(CNF) is calculated as:

$$w(CNF)=m(CNF)/(m(A)+m(CNF))$$

where m(CNF) is the mass of conductive nano-filler in said first composition, and m(A) is the mass of the thermoplastic polymer (A) in said first composition, and wherein the amount of thermoplastic polymer (A) combined with the resin precursor is such that the mass fraction w(A), calculated as w(A)=m(A)/m, where m(A) is the mass of the thermoplastic polymer (A) present in the cured thermoset resin composition having the mass m, is from 0.5% to 40%.

3. A process according to claim 1, wherein said first composition is in micronized particulate form, and the micronized particulate exhibits an average particle size in the range of from about 10 to about 150 μm.

4. A process according to claim 1, wherein said polyarylethersulphone thermoplastic polymer (A) comprises ether-linked repeating units, optionally further comprising thio-ether-linked repeating units, the units being selected from:

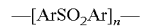

and optionally from:

wherein:
Ar is phenylene;
n=1 to 2 and can be fractional;
when —[Ar]$_a$— is present, a=1 to 3 and can be fractional and when a exceeds 1, said phenylene groups are linked linearly through a single chemical bond or a divalent group other than —SO$_2$—, or are fused together,
provided that the repeating unit —[ArSO$_2$Ar]$_n$— is always present in the polyarylethersulphone in such a proportion that on average at least two of said —[ArSO$_2$Ar]$_n$— units are in sequence in each polymer chain present, and wherein the polyarylethersulphone has one or more reactive pendant and/or end group(s).

5. A process according to claim 4, wherein the repeating units in said polyarylethersulphones are:

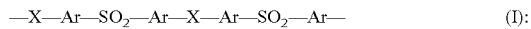
—X—Ar—SO$_2$—Ar—X—Ar—SO$_2$—Ar— (I):

and

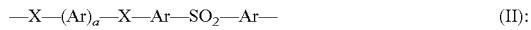
—X—(Ar)$_a$—X—Ar—SO$_2$—Ar— (II):

wherein:

X is O or S and may differ from unit to unit.

6. A process according to claim 5, wherein said reactive pendant- and/or end-group(s) are selected from the group consisting of: OH, NH$_2$, NHR$^b$ and —SH, wherein R$^b$ is a hydrocarbon group containing up to eight carbon atoms.

7. A process according to claim 1, wherein the one or more conductive nano-filler(s) are carbon nano-tubes.

8. A process according to claim 1, wherein the second composition further comprises one or more conductive nano-filler(s), and said conductive nano-filler(s) in the second composition are the same as or different to the conductive nano-filler(s) in the first composition.

9. A process according to claim 1, wherein said thermoplastic polymer(s) is dissolved in said thermosetting resin precursor formulation.

10. A process according to claim 1, wherein one or more curing agent(s) is/are present, and the curing agent(s) is/are added after the mixing of said one or more uncured thermoset resin precursor(s) (P) with the first composition.

11. A process according to claim 1, wherein said thermosetting resin precursor(s) (P) is/are epoxy resin precursor(s).

12. A process according to claim 1, wherein the forming of the first composition comprises conducting polymerisation of said thermoplastic polymer(s) (A) in the presence of the conductive nano-filler(s).

13. A process according to claim 1, wherein the first composition is in the form of pellets, or particles, or fibers, which are formed by mixing one or more conductive nano-filler(s) and one or more polyarylethersulphone thermoplastic polymer(s) (A) in a screw extruder to form a mixture and extruding the mixture.

14. A process according to claim 1, wherein said first composition is in the form of pellets, or particles, or continuous or chopped fibers.

15. A process according to claim 1, wherein the thermoset resin precursor(s) is/are mono- or poly-glycidyl derivative(s) of one or more compounds selected from the group consisting of: aromatic diamines, aromatic monoprimary amines, aminophenols, polyhydric phenols, polyhydric alcohols, and polycarboxylic acids epoxy resin precursor(s).

* * * * *